US007218484B2

(12) United States Patent
Hashimoto et al.

(10) Patent No.: US 7,218,484 B2
(45) Date of Patent: May 15, 2007

(54) MAGNETORESISTANCE EFFECT ELEMENT, MAGNETIC HEAD, AND MAGNETIC REPRODUCING APPARATUS

(75) Inventors: Susumu Hashimoto, Kanagawa-ken (JP); Katsuhiko Koui, Kanagawa-ken (JP); Masashi Sahashi, Kanagawa-ken (JP); Hitoshi Iwasaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 319 days.

(21) Appl. No.: 10/659,299

(22) Filed: Sep. 11, 2003

(65) Prior Publication Data
US 2004/0201929 A1    Oct. 14, 2004

(30) Foreign Application Priority Data
Sep. 11, 2002    (JP)    ............................ 2002-265883

(51) Int. Cl.
G11B 5/39    (2006.01)
(52) U.S. Cl. .................................................. 360/324.1
(58) Field of Classification Search .............. 360/324.1
See application file for complete search history.

(56) References Cited
U.S. PATENT DOCUMENTS

| 5,715,121 | A | 2/1998 | Sakakima et al. | ....... 360/324.2 |
| 6,560,077 | B2 * | 5/2003 | Fujiwara et al. | ......... 360/324.1 |
| 2003/0123200 | A1 * | 7/2003 | Nagasaka et al. | ........ 360/324.1 |
| 2004/0086751 | A1 * | 5/2004 | Hasegawa et al. | ......... 428/692 |
| 2005/0002126 | A1 * | 1/2005 | Fujiwara et al. | ......... 360/324.1 |

FOREIGN PATENT DOCUMENTS

JP    3293437    4/2002

OTHER PUBLICATIONS

Fukuzawa et al, "Specular spin-valve films with an FeCo nano-oxide layer by ion-assisted oxidation", May 15, 2002, J. Ap. Phys. v. 91 No. 10 p. 6684).*
Physical Review B, vol. 45 No. 2, pp. 806-813, (Jan. 1, 1992), Giant magnetoresistance of magnetically soft sanwiches: Dependence on temperature and on layer thicknesses, B. Dieny et al.

(Continued)

Primary Examiner—Julie Anne Watko
(74) Attorney, Agent, or Firm—Oblon, Spivak, McClelland, Maier & Neustadt, P.C.

(57) ABSTRACT

A magnetoresistance effect element comprises: a magnetoresistance effect film, a pair of electrodes, and a phase separation layer. The magnetoresistance effect film includes a first ferromagnetic layer whose direction of magnetization is pinned substantially in one direction, a second ferromagnetic layer whose direction of magnetization changes in response to an external magnetic field, and an intermediate layer provided between the first and second ferromagnetic layers. The pair of electrodes are electrically coupled to the magnetoresistance effect film and configured to supply a sense current perpendicularly to a film plane of the magnetoresistance effect film. The phase separation layer is provided between the pair of electrodes. The phase separation layer has a first phase and a second phase formed by a phase separation in a solid phase from an alloy including a plurality of elements. One of the first and second phases includes at least one element selected from the group consisting of oxygen, nitrogen, fluorine and carbon in higher concentration than other of the first and second phases.

12 Claims, 24 Drawing Sheets

OTHER PUBLICATIONS

Applied Physics, vol. 69, pp. 4774-4779, (Apr. 15, 1991) Magnetotransport properties of magnetically soft spin-valve structures (invited), B. Dieny et al.

"Handbook of oxides", Japan-Soviet Press bureau, 1969; This reference is related to a thermo-dynamic parameter for oxides.

* cited by examiner

MAGNETORESISTANCE EFFECT ELEMENT, MAGNETIC HEAD, AND MAGNETIC REPRODUCING APPARATUS

CROSS-REFERENCE TO RELATED APPLICATIONS

This application is based upon and claims the benefit of priority from the prior Japanese Patent Application No. 2002-265883, filed on Sep. 11, 2002; the entire contents of which are incorporated herein by reference.

BACKGROUND OF THE INVENTION

The present invention relates to a magnetoresistance effect element, a manufacturing method of a magnetoresistance effect element, a magnetic head and a magnetic reproduction apparatus, and more particularly, it relates to a magnetoresistance effect element where a sense current flows perpendicularly to the film plane, a manufacturing method of the magnetoresistance effect element, and a magnetic head and a magnetic reproduction apparatus including the magnetoresistance effect element.

Although a magnetic storage density of HDD (hard disk drive) is improved dramatically in recent years, it has been desired to raise the magnetic storage density further. Since a record bit size becomes small as the magnetic storage density is raised, a reproducing sensitivity is lowered in the conventional thin film head. Therefore, now, the magnetoresistance effect type head (MR head) including a magnetoresistance effect (MagnetoResistive effect) has been used mainly. A spin valve (spin-valve) type giant magnetoresistance type head (SVGMR head) which shows a big magnetoresistance effect has attracted attention.

FIG. 29 is a schematic diagram which illustrates the outline section structure of the spin valve film. That is, the spin valve film 100 has the structure in which a ferromagnetic layer F, a non-magnetic layer S, a ferromagnetic layer P, and an antiferromagnetic layer A are laminated in this order.

The non-magnetic layer S is interposed between the two ferromagnetic layers F and P which are in a magnetically uncoupled state. Magnetization of one ferromagnetic layer P is fixed with an exchange bias using the antiferromagnetic material A, and whereas the magnetization of other ferromagnetic layer F is able to rotate easily by an external magnetic fields (signal magnetic field etc.). And a giant magnetoresistance effect can be obtained by rotating only magnetization of the ferromagnetic layer F by an external magnetic field and changing its magnetic orientation relative to that of the other magnetic layer (Phys. Rev. B, Vol.45, 806 (1992), J. Appl. Phys. Vol.69, 4774 (1991)).

Here, the ferromagnetic layer F is called a "free layer", a "magnetic field reception layer", or a "magnetically free layer", the ferromagnetic layer P is called a "pinned layer", a "magnetically pinned layer" or a "magnetically fixed layer", and the non-magnetic layer S is called a "spacer layer", "a magnetic coupling interception layer", etc. in many cases.

In the case of the spin valve film, since magnetization of the free layer F, i.e., a ferromagnetic layer, can be rotated also in the lower field, it is possible to raise reproduction sensitivity and it is suitable for MR element for MR heads.

In the case of such a spin valve element, it is necessary to pass the "sense current" in order to detect a change of the resistance caused by a magnetic field.

For this reason, the method of passing the sense current in parallel to a film plane and measuring resistance of a parallel direction to a film plane is generally used. Generally this method is called the "CIP (current-in-plane)" system.

In the case of the CIP system, the value of about 10% through 20% can be obtained as a change rate of MR. Moreover, in the MR head of the shield type used currently, the spin valve element is used in the plane shape almost near a square. Therefore, it is considered that the resistance of MR element is equal to the resistance of MR film plane. For this reason, in the spin valve film of a CIP system, a good S/N characteristic can be obtained by making the resistance of the film plane into 5 ohms through 30 ohms. Resistance of this level can be easily made by making the thickness of the whole spin valve film thin. Therefore, generally the spin valve film of the CIP system is used as the MR element for MR heads currently.

On the other hand, the magnetoresistance effect element (hereafter called a "CPP type artificial lattice") where the sense current is passed perpendicularly (current perpendicular to plane: CPP) to the film plane in the artificial lattice in which a magnetic material and a non-magnetic material are laminated is proposed as a method of obtaining big MR which exceeds 30%.

In a CPP type artificial lattice type magnetoresistance effect element, the electrode is provided in the upper and lower sides of the artificial lattice in which the ferromagnetic layers and the non-magnetic layers are laminated by turns, and the sense current flows perpendicularly to the film plane. With this structure, since the probability that the sense current crosses a magnetic layer/non-magnetic layer interface becomes high, an interface effect can be obtained and big change rate of MR can be obtained.

However, in using MR element for an MR head, it is necessary not only to control the magnetization of a magnetic layer and to enable it to measure an external magnetic field efficiently by it, but also to form each magnetic layer into a single magnetic domain so that a Barkhausen noise etc. may not occur simultaneously. However, as mentioned above, it is necessary to laminate magnetic layers and non-magnetic layers repeatedly by turns in order to earn resistance in the case of the CPP type MR element, therefore, it is technically very difficult to individually control the magnetization of each of such many the magnetic layers.

On the other hand, the CPP system can be adopted also in the spin valve structure using FeMn/NiFe/Cu/NiFe, FeMn/CoFe/Cu/CoFe, etc.

That is, the sense current is passed perpendicularly to the film plane of the laminated films which have a spin valve structure. However, since the number of pinned layers and free layers becomes much smaller than that of the artificial lattice type, the resistance falls further and a resistance rate of change also falls.

As for this point, the magnetoresistance effect element in which the non-magnetic film which consists of the mixture of an insulator and an electric conductor is inserted is proposed in Japanese Patent No.3293437.

The CPP type magnetoresistance effect element in which the non-magnetic film which has the structure where an insulator I surrounds the electric conductors C is inserted is disclosed in FIG. 1 of Japanese Patent No.3293437. However, as the example of the structure of the non-magnetic film disclosed in Japanese Patent No.3293437, there is only an explanation that non-magnetic films having thickness of 2 nm or 5 nm was deposited by using the multi-component target including $Al_2O_3$ and Cu, and it is unknown what kind of structure was made concretely as the non-magnetic film.

As explained above, various structures, such as a spin valve film of a CIP type, an artificial lattice of a CPP type, and spin valve film of a CPP type have been proposed. However, the present magnetic storage density is continuing the rise of an annual rate of 60% or more, and the further output increase has been desired. However, the spin valve film which can be used with high storage density which exceeds 100 Gbits/inch$^2$ at present and which has suitable resistance and the big amount of MR change, and serves as high sensitivity magnetically is difficult to realize.

SUMMARY OF THE INVENTION

According to an embodiment of the invention, there is provided a magnetoresistance effect element comprising: a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers; a pair of electrodes electrically coupled to the magnetoresistance effect film and configured to supply a sense current perpendicularly to a film plane of the magnetoresistance effect film; and a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases.

According to other embodiment of the invention, there is provided a magnetoresistance effect element comprising: a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers; a pair of electrodes electrically coupled to the magnetoresistance effect film and configured to supply a sense current perpendicularly to a film plane of the magnetoresistance effect film; a magnetic layer provided between the pair of electrodes, the magnetic layer comprising a first region and a second region, the first region including at least one element selected from the group consisting of oxygen, nitrogen, fluorine and carbon in higher concentration than the second region; and a magnetic coupling interception layer provided between the magnetic layer and the first or second ferromagnetic layer.

According to other embodiment of the invention, there is provided a magnetoresistance effect element comprising: a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers; a pair of electrodes electrically coupled to the magnetoresistance effect film and configured to supply a sense current perpendicularly to a film plane of the magnetoresistance effect film; a magnetic layer provided between the pair of electrodes, the magnetic layer comprising a first region and a second region, the first region including at least one element selected from the group consisting of oxygen, nitrogen, fluorine and carbon in higher concentration than the second region; and a layer provided between the magnetic layer and the first or second ferromagnetic layer, the layer having a thickness between 1 nm and 3 nm and including at least one element selected from the group consisting of copper, gold, silver, rhenium, osmium, ruthenium, iridium, palladium, chromium, magnesium, aluminum, rhodium and platinum.

According to other embodiment of the invention, there is provided a method of manufacturing a magnetoresistance effect element comprising a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers, a pair of electrodes electrically coupled to the magnetoresistance effect film and configured to supply a sense current perpendicularly to a film plane of the magnetoresistance effect film, comprising: distributing a first and second phases in a film plane by inducing a phase separation in a layer made of an alloy including a plurality of elements.

According to other embodiment of the invention, there is provided a magnetic head comprising a magnetoresistance effect element comprising: a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers; a pair of electrodes electrically coupled to the magnetoresistance effect film and configured to supply a sense current perpendicularly to a film plane of the magnetoresistance effect film; and a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases.

According to other embodiment of the invention, there is provided a magnetic reproducing apparatus which reads magnetic information in a magnetic recording medium, the magnetic reproducing apparatus comprising a magnetoresistance effect element for reading the magnetic information comprising: a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers; a pair of electrodes electrically coupled to the magnetoresistance effect film and configured to supply a sense current perpendicularly to a film plane of the magnetoresistance effect film; and a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings.

DETAILED DESCRIPTION

Figure 1:
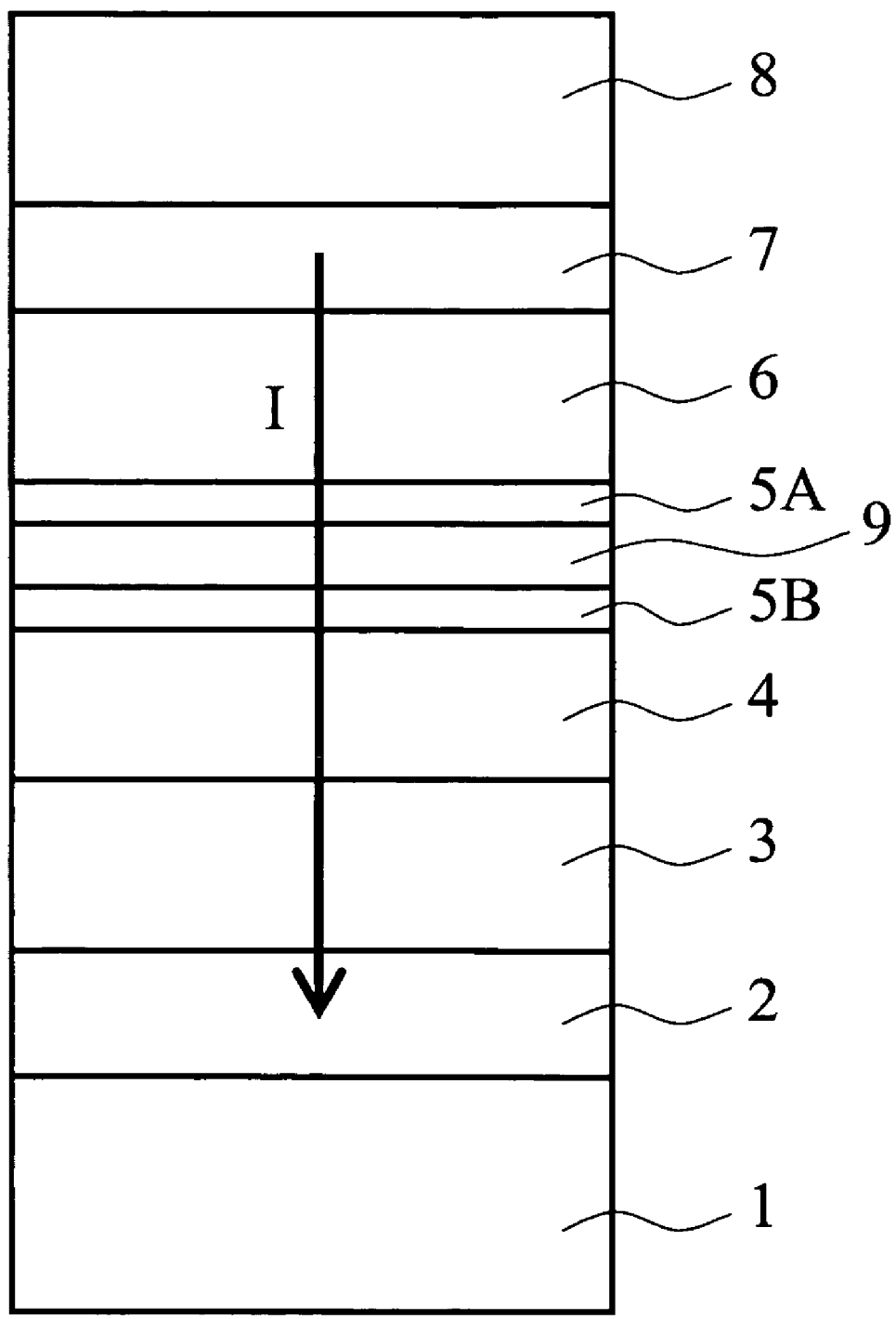
FIG. 1 is a schematic diagram showing the cross-sectional structure of the magnetoresistance effect element according to the first embodiment of the present invention.

Hereafter, some embodiment of the invention will be explained, referring to the drawings.

(First Embodiment)

FIG. 1 is a schematic diagram showing the cross-sectional structure of the magnetoresistance effect element according to the first embodiment of the present invention.

In this figure, reference numeral 1 corresponds to a substrate electrode, 2 corresponds to a base layer, 3 corresponds to an antiferromagnetic layer, 4 corresponds to a magnetically fixed layer (pinned layer), 5A corresponds to a magnetic coupling interception layer, 5B corresponds to an interface adjustment layer, 6 corresponds to a magnetically free layer (free layer), 7 corresponds to a protective layer, 8 corresponds to an upper electrode layer, and 9 corresponds to a phase separation layer. That is, this element is a CPP type magnetoresistance effect element where the sense current I flows (in a direction of the arrow of this figure or opposite direction thereto) between the substrate electrode 1 and the phase separation layer 9.

And magnetic coupling interception layer 5A, interface adjustment layer 5B, and the phase separation layer 9 have a role as an intermediate layer (spacer layer) which intercepts the magnetic coupling between the magnetically fixed layer 4 and the magnetically free layer 6.

Moreover, the phase separation layer 9 has the role of making the substantial element size smaller effectually and enlarging the amount of resistance change, by narrowing down the current path of the sense current I.

Figure 2:
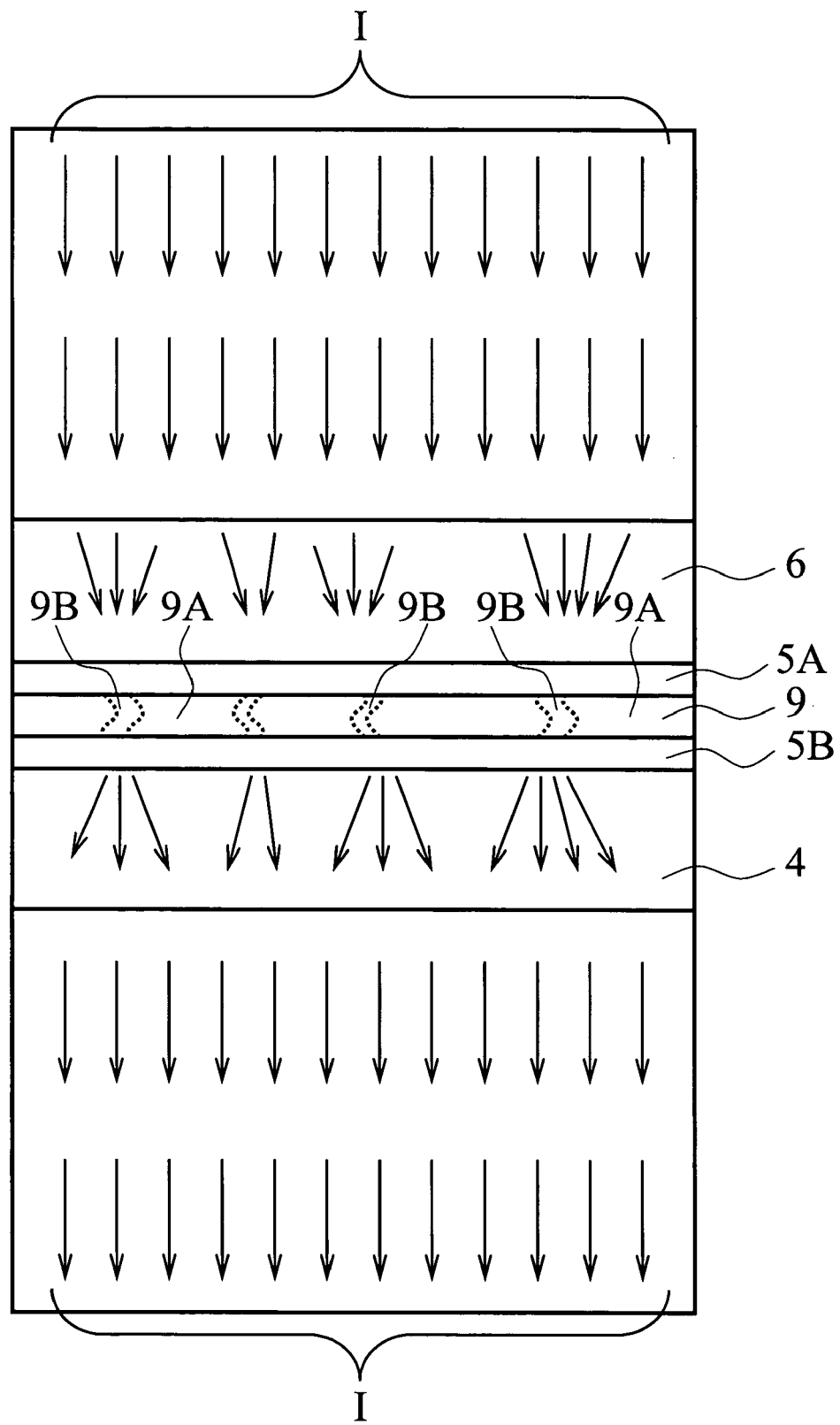
FIG. 2 is a diagram which illustrating a state that the phase separation layer 9 narrows down the sense current.

FIG. 2 is a diagram which illustrates that the phase separation layer 9 narrows down the sense current. As illustrated in FIG. 2, since two-dimensional "variation" of the resistance is provided in the film plane of the phase separation layer 9 and there are portions to which the current concentrates, such a current constriction effect is produced.

Namely, the resistance of the phase separation layer 9 varies two dimensionally, and the phase separation layer 9 has a region 9A where the resistance is relatively higher and regions 9B where the resistance is relatively lower. The sense current I supplied to the spin valve film from the electrode is blocked by the region 9A of higher resistance, and flows through the regions 9B of lower resistance formed locally in the phase separation layer 9. In this embodiment, since the current flows through such regions 9B of lower resistance, the current characteristic about the phase separation layer 9 maintains the "ohmic nature".

On the other hand, in the case of the so-called TMR (tunneling magnetoresistance effect) element, an insulating layer is provided between a pair of magnetic material layers, and the sense current passes through this insulating layer by tunneling. Therefore, the current characteristic over the insulating layer in a TMR element shows a so-called "tunneling characteristic."

In contrast, in the magnetoresistance effect element of this embodiment, it is the point that sense current passes the regions 9B of lower resistance of the phase separation layer 9, and the ohmic nature is essentially obtained. Therefore, the temperature characteristics of the current differ greatly from that of the TMR element, for example.

One of the methods of investigating whether the current flowing nature depends on the ohmic current path or on the tunneling mechanism of TMR is to investigate a relation between the sense current and a magnetoresistance effect. That is, in the case of TMR, when the resistance of the element is low, since a breakdown takes place easily, stability cannot be acquired. When a tendency of a change rate of magnetoresistance to decrease with an increase of the sense current is seen, a possibility of being TMR is very high.

Alternatively, they can be distinguished by investigating the temperature dependency of resistance. That is, in the case of an ohmic system, the resistance decreases if the temperature is lowered down to about minus 200 degrees centigrade from the room temperature, while the resistance increases in the case of TMR.

Figure 3:
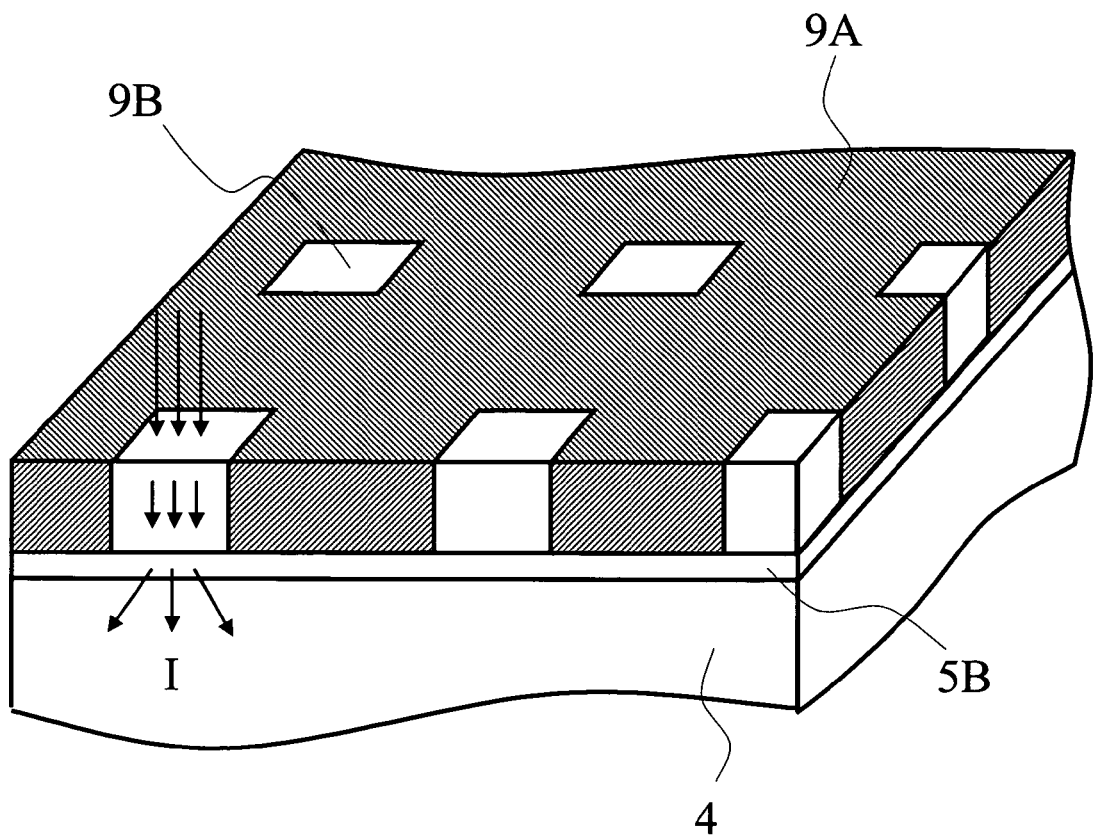
FIG. 3 is a schematic diagram showing the example of the superficial composition of the phase separation layer 9.

FIG. 3 is a schematic diagram showing the example of the planar structure of the phase separation layer 9. As shown in this figure, in the phase separation layer 9, the region 9A of higher resistance and the regions 9B of lower resistance exist separately.

The two-dimensional separation structure is formed by a phase separation in a solid phase, such as "spinodal decomposition" and "GP zone (Guinier-Preston zone)." That is, the phase separation layer 9 provided between the magnetically pinned layer 4 and the magnetically free layer 6 has a structure where a phase separation in a solid phase into two or more phases by mechanisms such as spinodal decomposition and formation of GP zone has taken place in an alloy which consists of two or more kinds of elements.

Moreover, in this embodiment, either one of two or more phases separated by such a phase separation mechanism is oxidized preferentially by a treatment such as an exposure to an oxygen atmosphere, oxygen radical irradiation and heat treatment. That is, the region 9A (insulating phase) of higher resistance is formed by carrying out oxidization process of a part of phase separation layer phase-separated in a solid phase with mechanisms, such as spinodal decomposition and formation of GP zone. And the regions 9B (electric conduction phase) of a lower resistance with non-oxidized state are distributed in the region 9A.

Therefore, if the phase separation takes place so that one phase is easier to be oxidized than the other phase when phase-separated into two phases by a mechanism such as spinodal decomposition, it becomes easy to form the structure where the electric conduction phases are distributed in an insulating phase.

In order to realize such a current narrowing structure, it is desirable to choose an alloy system where the phase separation takes place to form one phase containing an element which is easy to be oxidized and other phase containing an element which is hard to be oxidized.

According to "handbook of oxides" edited by Samsonov, Japan-Soviet press bureau (1969), the free energies of formation of oxides of the elements in connection with the invention are as follows:

TABLE 1

| element | oxide | free energy of formation, $\times 10^{-6}$ J/kmol |
|---------|-------|---------------------------------------------------|
| Au | Au2O3 | 163 |
| Ag | Ag2O | −11 |
| Cu | CuO | −127 |
| Co | CoO | −213 |
| Ni | NiO | −216 |
| Fe | FeO | −244 |
| Ru | RuO2 | −253 |
| Mo | MoO2 | −502 |
| Mg | MgO | −573 |
| W | WO3 | −763 |
| Si | SiO2 | −805 |
| Zr | ZrO2 | −1037 |
| Cr | Cr2O3 | −1048 |
| Hf | HfO2 | −1084 |
| Mn | Mn2O3 | −1281 |
| Al | Al2O3 | −1580 |
| Nb | Nb2O5 | −1770 |
| Ta | Ta2O5 | −1970 |

As the free energy of formation of oxide of the element becomes smaller, it becomes easier to oxidize the element. That is, in Table 1, elements listed in the upper columns cannot be oxidized easily and elements listed in the lower columns tend to be oxidized easily.

Noble metal elements, such as gold (Au), silver (Ag) and copper (Cu), have free energy of formation of oxidation larger than other elements, and are suitable for the phase of lower resistance which does not form oxides easily. Although iron (Fe), cobalt (Co), nickel (Ni) form the oxides easier than those noble metal elements, they do not form oxides more easily compared to the elements listed in the lower columns, such as tantalum (Ta), niobium (Nb), aluminum (Al) and silicon (Si).

Therefore, it is effective to appropriately choose the elements of the alloy system by combining an element having a larger free energy of formation of oxide and an element having a smaller free energy of formation of oxide.

Nitridation, fluoridation or carbonization may also be used instead of oxidation, as will be detailed later.

Some alloy systems have a phase separation which produce a high electric conduction phase 9B and a insulating phase 9B having a resistance 10 times or more than 100 times larger than the resistance of the conduction phase 9B, thus oxidation process is not needed.

According to the embodiment, it becomes easy to form the phase separated structure having the regions 9A and 9B by using the phase separation in a solid phase such as spinodal decomposition, formation of GP zone, etc. It also becomes certain and easy to control the ratio and distribution of the separated phases.

According to examination of the inventors, it has turned out that the practical CPP type magnetoresistance effect element which has suitable resistance can be obtained while maintaining the spin dependent dispersion effect effectively, when the particle diameter of high electric conduction phase 9B is 0.8 to 4 times larger than the thickness of the phase separation layer 9 and when the average interval of the neighboring high electric conduction phases is made in a range from 1 nm to 10 nm. The particle diameter and an interval of high electric conduction phases can be measured by TEM (transmission electron microscopy).

By using spinodal decomposition or the phase separation mechanism of GP zone formation, the particle diameter and interval of the high electric conduction phase are regularly controllable by adjusting the material composition of the phase separation layer 9, and/or by adjusting the conditions of the phase separation promotion process (for example, heat treatment, ion irradiation of rare gas such as Ar, plasma irradiation of rare gas such as Ar, etc.). Moreover, the result is sufficiently reproducible. Therefore, the ratio of the high electron conduction phase in the phase separation layer 9 can be precisely controlled into the rage mentioned above, and thus, magnetoresistance effect elements which have a desired characteristic can be produced reproducibly.

On the other hand, in the case of using a phase separation layer consisting of an $Al_2O_3$ insulating part and a Cu conductive part examined as a comparative example, since the interval of the conductive parts is determined by the particle diameter of the magnetically fixed layer or the magnetically free layer which lies under the phase separation layer, the interval of the conductive parts tends to be 10 nm or more, and they become sparse. In such a case, if a storage density rises and element size becomes smaller, the number of the conductive parts in an element will become fewer. Therefore, it will become difficult to control the ratio that the high electric conduction phases occupy in the phase separation layer, and thus, it will become difficult to control the element resistance and the amount of resistance change.

Figure 4:
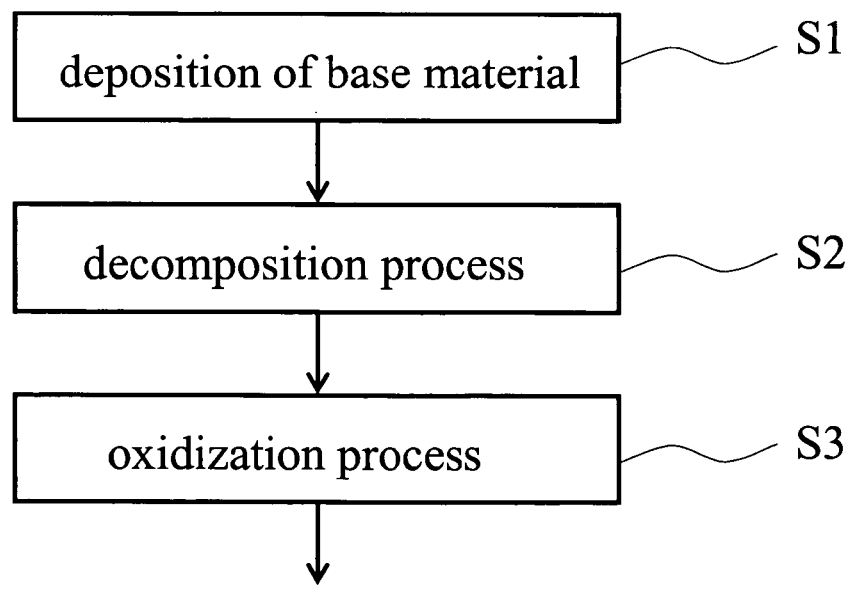
FIG. 4 is a flow chart showing a part of formation process of the phase separation layer 9 in the embodiment of the present invention.

FIG. 4 is a flow chart showing a part of formation process of the phase separation layer 9 in the embodiment of the invention.

Figure 5A:
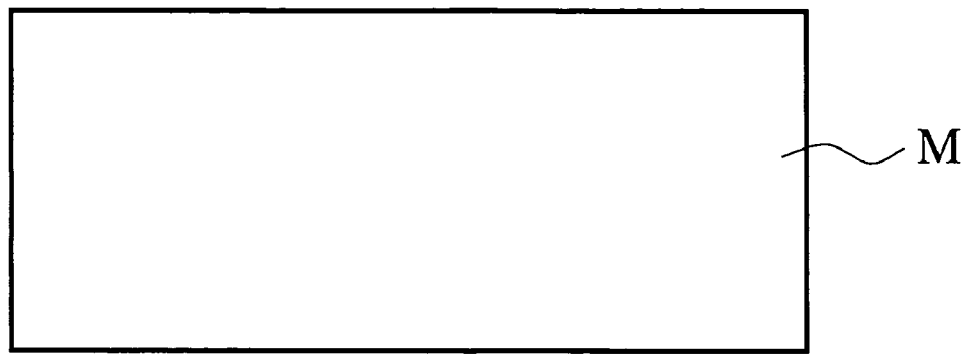
FIGS. 5A through 5C are schematic diagrams which illustrate the change of the planar structure of the phase separation layer 9.
Figure 5B:
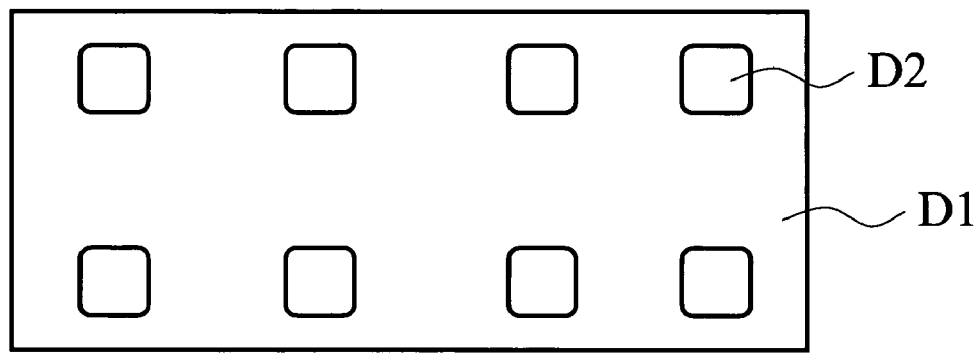
Figure 5C:
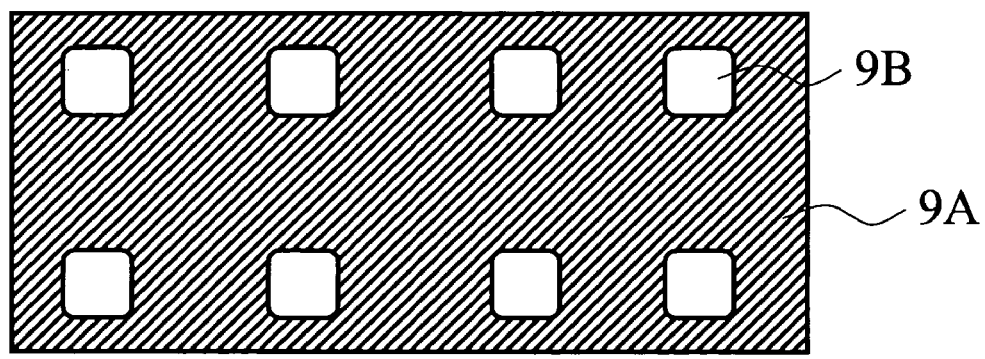

FIGS. 5A through 5C are schematic diagrams which illustrate change of the planar structure of the phase separation layer 9.

When forming the phase separation layer 9, the base material M is formed first in step S1. The base material M can be deposited in a form of a thin film by methods, such as a sputtering.

FIG. 5A shows the state where spinodal decomposition or formation of GP zone is not yet seen in the base material M. That is, the base material M is almost uniform during or immediately after the deposition process.

In the embodiment, the phase decomposition process S2 may be carried out simultaneously or after the deposition process of the base material M. As the decomposition process, a prolonged annealing at high temperature, irradiation of an ion beam, etc. can be mentioned.

By carrying out such a decomposition process in step S2, a spatial modulation in concentration takes place in the base material M and the material M will decompose into a phase D1 and a phase D2, as shown in FIG. 5B. Generally, in the case of spinodal decomposition, a nucleation does not take place but a fluctuation of composition becomes larger continuously. Therefore, it is considered that there is no incubation period, and decomposition takes place while keeping the conformity with a matrix perfectly.

In the case of the aluminum (Al) –4% copper (Cu) alloy, by an aging treatment at a room temperature or at an elevated temperature, a phase separation will takes place by forming a precipitated phase including copper with higher composition. For example, if the so-called "two-step ageing process" which includes an aging treatment at room temperature and a following precipitating process at elevated temperature is performed, a phase separated structure where minute regions having a higher concentration of copper is distributed uniformly in a matrix will be acquired.

As explained above, "variation" of composition takes places in the base material M by the decomposition process. As a result, the phase separation structure which is illustrated in FIG. 5B is formed.

Next, an oxidization process is carried out as step S3. As the oxidization process S3, a method of exposing to an atmosphere includes oxygen in the film forming chamber or a method of irradiating an oxygen radical, etc. can be used. Instead of the oxidization, a nitridation, fluoridation, or carbonization can be appropriately used according to the base material M.

By such an oxidization process, one of the separated phases D1 and D2 having a composition easy to be oxidized is oxidized preferentially. In the example shown in FIG. 5C, the phase D1 is oxidized and the region 9A of higher resistance is formed. On the other hand, the phase D2 which is hardly oxidized constitutes the region 9B of lower resistance.

Figure 6:
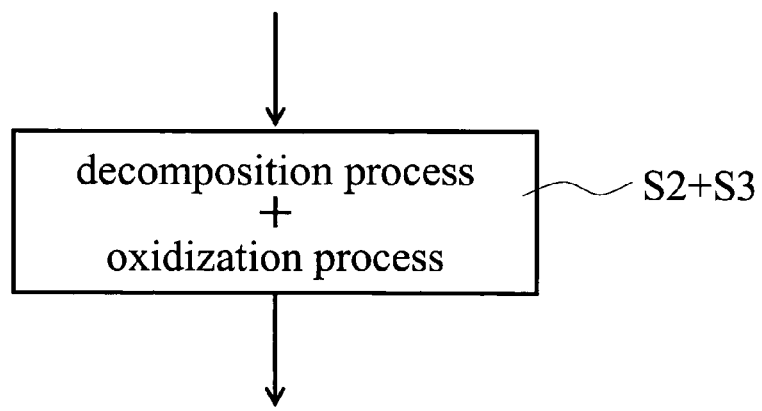
FIG. 6 is a flow chart showing the other method of forming the phase separation layer 9.

FIG. 6 is a flow chart showing another method of forming the phase separation layer 9.

That is, it is not necessary to carry out the phase decomposition process and the oxidization process separately, and they may be carried out simultaneously.

For example, it is possible to expose the layer 9 to an oxygen atmosphere or to irradiate an oxygen radical simultaneously with the annealing treatment for phase separation. Thus, steps S2 and S3 can be carries out simultaneously.

Furthermore, the process of decomposition and oxidization can also be carried out simultaneously with the deposition process of the base material M. For example, it is also possible to carry out the deposition process, the phase decomposition process and the oxidization process simultaneously, by irradiating the substrate with an ion beam which contains oxygen ion during the film forming process of the base material M.

As explained above, when the decomposition process S2 and the oxidization process S3 are carried out simultaneously, the base material M is oxidized and a part of the region 9A of high resistance may be constituted.

Figure 7:
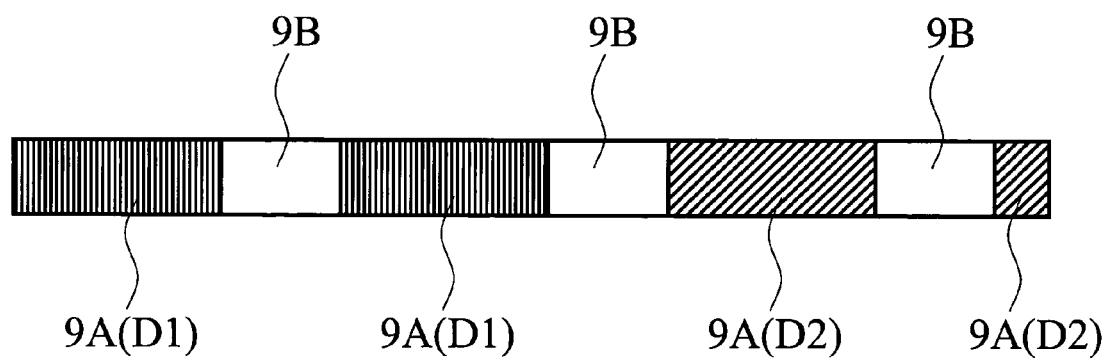
FIG. 7 is a schematic sectional view showing the example of the phase separation in two or more kinds of solid phases depending on the composition element which forms the base material.

FIG. 7 is a conceptual sectional view showing the example of the phase separation in two or more kinds of separated solid phases. In the case of this example, since the base material of the phase separation layer 9 consists of an element which carries out two or more phase separations of solid phases, two kinds of spinodal decompositions are carried out in the phase separation layer 9.

Consequently, in the phase separation layer 9, the regions 9A (D1) and 9A (D2) of high resistance formed by the phase D1 and phase D2 being oxidized, and an electric conduction phase 9B of the low resistance formed of metallic elements which are different from the regions 9A (D1) and 9A (D2) of high resistance are formed.

A structure of three or more phases which includes two or more kinds of phases of higher resistance and a phase of lower resistance can also be used as the phase separation layer 9 of the embodiment.

Figure 8:
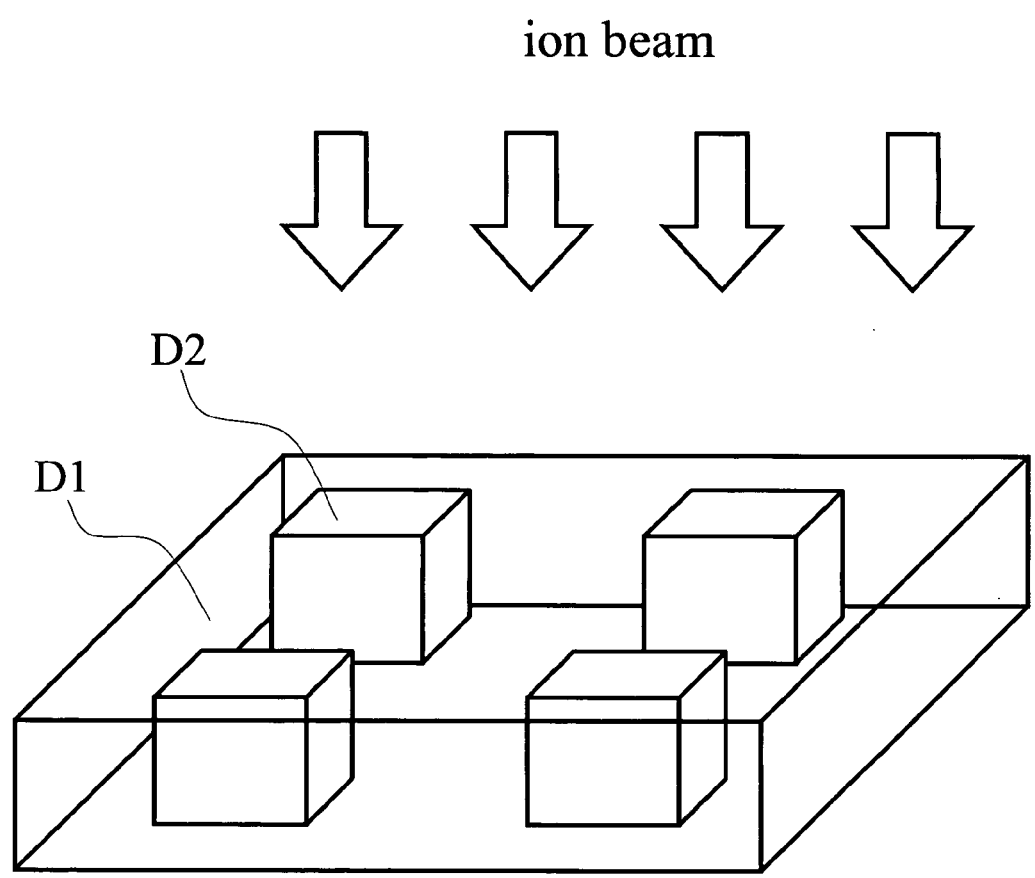
FIG. 8 is the schematic diagram which expresses the method of irradiating an ion beam as a separating process S2 which produces espinodal decomposition.

On the other hand, the method of irradiating an ion beam as illustrated in FIG. 8 is also effective as the decomposition process S2 which accelerates a phase separation such as spinodal decomposition and GP zone formation in the embodiment. That is, by irradiating an ion beam, the energy for producing variation of composition in the base material M formed in a shape of a thin film is given, and the phase separation is accelerated.

Rare gas elements, such as argon (Ar), xenon (Xe), and krypton (Kr), can be used as the ion beam in this case. When carrying out simultaneously with an oxidization (or nitridation, fluoridation, carbonization) process, oxygen (or nitrogen, fluoride, carbon) can also be used as the source of the ion beam.

The irradiation condition can be appropriately chosen so that etching of the base material M of the phase separation layer 9 does not take place notably. For example, an argon ion beam can be irradiated with about 50 volts of accelerating voltage and about 50 watts of electric power.

Next, the example of the base material M of the phase separation layer of this embodiment will be explained.

As one of the base materials M of the separation layer 9 which has the phase separation structure in a solid phase, an alloy of a noble metal element and one of nickel (Ni), iron (Fe) and cobalt (Co) can be used.

As the noble metal, silver (Ag), gold (Au), copper (Cu), platinum (Pt), palladium (Pd), iridium (Ir), osmium (Os) or copper (Cu) can be used.

If an oxidization process is performed by using the oxygen radical previously stated to the alloy of noble metal-Ni—Fe or alloy of noble metal-Ni—Co, the phase (D1) which has higher composition of Ni—Fe or Ni—Co is oxidized selectively and a high insulating phase (region 9A) is formed. By performing a heat treatment after forming the laminated structure of the magnetoresistance effect film, the phase separation of the phase separation layer 9 into the electric conduction phase (noble metal) and an insulating phase (Ni—Fe—$O_x$ and Ni—Co—$O_x$) is accelerated. Thus, the purity of the noble metal in the electric conduction phase increases, and the resistance thereof becomes lower.

Such a phase separation and a selective oxidization can be realized with alloys expressed by the following formula:

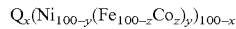
$Q_x(Ni_{100-y}(Fe_{100-z}Co_z)_y)_{100-x}$ where Q is the noble metal element. In the above formula, it is desirable that the following conditions are satisfied:
1≦x (atomic %)≦50;
0≦y (atomic %)≦50; and
0≦z (atomic %)≦100.

Alloys expressed by the following formula can also be used as the material of the phase separation layer 9:

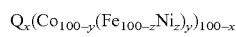
$Q_x(Co_{100-y}(Fe_{100-z}Ni_z)_y)_{100-x}$ where Q is the noble metal element. In the above formula, it is desirable that the following conditions are satisfied:
1≦x (atomic %)≦50;
0≦y (atomic %)≦50; and
0≦z (atomic %)≦100.

Here, it is desirable to use at least one of silver (Ag), gold (Au), platinum (Pt), palladium (Pd), iridium (Ir), osmium (Os), and the copper (Cu) as the "noble metal element". Moreover, instead of using only one noble metal element, two or more kinds of noble metal elements may also be incorporated in an alloy.

In this case, the composition x of the noble metal Q is a total sum of the compositions of the selected noble metal elements. For example, when silver and platinum are chosen as the noble metal elements Q, the composition x is the total sum of silver composition and platinum composition.

Alternatively, alloys expressed by the following formula may also be used as the material of the phase separation layer 9:

$(Al_{100-y}Q_y)_{100-x}M_x$ where element M is at least one of silver (Ag), gold (Au), platinum (Pt), copper (Cu), palladium (Pd), iridium (Ir) and osmium (Os), and element Q is at least one of magnesium (Mg), calcium (Ca), silicon (Si), germanium (Ge), boron (B), tantalum (Ta), tungsten (W), niobium (Nb), a zirconium (Zr), titanium (Ti), chromium (Cr), zinc (Zn), lithium (Li), and gallium (Ga).

Further, it is desirable that the following conditions are satisfied:
1≦x (atomic %)≦40.
0≦y (atomic %)≦50

In this alloy system, a phase separation into a phase with higher aluminum composition and a phase with lower aluminum composition takes place. Therefore, the phase (region 9A) of higher resistance in which aluminum and element Q is oxidized, and the metal (M) phase (region 9B) of lower resistance with comparatively higher purity can be obtained by performing oxidization process.

Furthermore, spinodal decomposition or nucleation are accelerated at lower temperature by making the composition x in a range between 1% and 40% and using the thin film formation techniques, such as the sputtering method.

It is more desirable to make the composition x in a range between 5% and 20%. If the composition x is made within this range, the phase (region 9B) of lower resistance is dotted in the phase (region 9A) of higher resistance. Consequently, the path of the sense current is narrowed efficiently and the good current narrowing effect is acquired.

Figure 9:
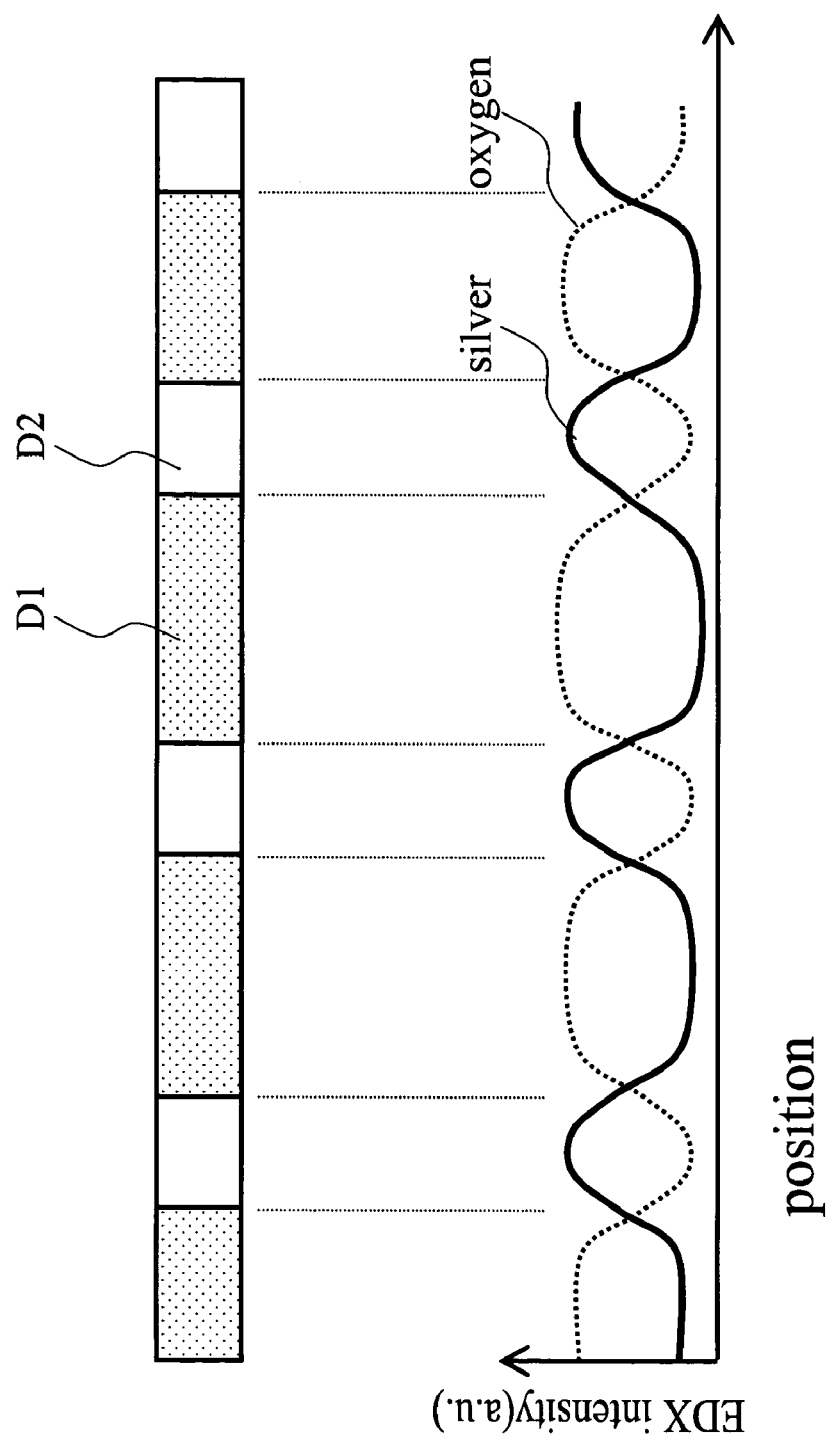
FIG. 9A is a schematic diagram of the TEM image of the section of the phase separation layer which is phase-separated with the base material of $Al_{90}Ag_{10}$ alloy and is oxidized.
FIG. 9B is a schematic diagram showing the profile of the elemental analysis by nano-EDX (Energy Dispersive X-ray photoelectron spectroscopy) of the phase separation layer.

FIG. 9A is a schematic diagram of the TEM image of the section of the phase separation layer which is phase-separated from the base material of $Al_{90}Ag_{10}$ and experienced an oxidization process. FIG. 9B is a schematic diagram showing the profile of the element analysis by nano-EDX (Energy Dispersive X-ray photoelectron spectroscopy) of this phase separation layer.

The regions where composition of aluminum (Al) is higher are oxidized and the phase D1 of higher resistance is formed, and the regions where silver (Ag) composition is high form the phase D2 of lower resistance.

On the other hand, alloy system expressed by the following formula may also be used as the base material of the phase separation layer 9:

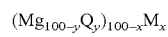
$(Mg_{100-y}Q_y)_{100-x}M_x$ where the element M is at least one of silver (Ag), gold (Au), platinum (Pt), palladium (Pd), copper (Cu), iridium (Ir), and osmium (Os), and the element Q is at least one of calcium (Ca), silicon (Si), germanium (Ge), zinc (Zn), lithium (Li), and gallium (Ga).

Further, it is desirable that the following conditions are satisfied:
1≦x (atomic %)≦40; and
0≦y (atomic %)≦30.

In this alloy system, a phase separation into a phase with higher magnesium composition and a phase with lower magnesium composition takes places. Therefore, the phase (region 9A) of high resistance in which magnesium and element Q is oxidized, and the metal (M) phase (region 9B) of low resistance with comparatively high purity can be obtained by performing oxidization process.

Furthermore, spinodal decomposition or nucleation are accelerated at lower temperature by making the composition x in a range between 1% and 40% and by using the thin film formation techniques, such as the sputtering method.

It is more desirable to make the composition x into a range between 5% and 20%. If the composition x is made within this range, the phase (region 9B) of lower resistance is dotted in the phase (region 9A) of higher resistance. Consequently, the path of the sense current is narrowed efficiently and the good current narrowing effect is acquired.

Alternatively, alloys expressed by the following formula may also be used as the material of the phase separation layer 9:

$$(Si_{100-y}Q_y)_{100-x}M_x$$

where element M is at least one of silver (Ag), gold (Au), platinum (Pt), copper (Cu), palladium (Pd), iridium (Ir) and osmium (Os), and element Q is at least one of magnesium (Mg), calcium (Ca), germanium (Ge), zinc (Zn), lithium (Li), and gallium (Ga).

Further, it is desirable that the following conditions are satisfied:

$1 \leq x$ (atomic %) $\leq 40$; and $0 \leq y$ (atomic %) $\leq 30$.

In this alloy system, a phase separation into a phase with higher silicon composition and a phase with lower silicon composition takes place. Therefore, the phase (region 9A) of higher resistance in which silicon and element Q is oxidized, and the metal (M) phase (region 9B) of lower resistance with comparatively higher purity can be obtained by performing oxidization process.

Furthermore, spinodal decomposition or nucleation are accelerated at lower temperature by making the composition x in a range between 1% and 40% and using the thin film formation techniques, such as the sputtering method.

It is more desirable to make the composition x in a range between 5% and 20%. If the composition x is made within this range, the phase (region 9B) of lower resistance is dotted in the phase (region 9A) of higher resistance.

Alternatively, alloys expressed by the following formula may also be used as the material of the phase separation layer 9:

$$(Mn_{100-y}Q_y)_{100-x}M_x$$

where element M is at least one of silver (Ag), gold (Au), platinum (Pt), copper (Cu), palladium (Pd), iridium (Ir) and osmium (Os), and element Q is at least one of magnesium (Mg), calcium (Ca), germanium (Ge), zinc (Zn), lithium (Li), and gallium (Ga).

Further, it is desirable that the following conditions are satisfied:

$1 \leq x$ (atomic %) $\leq 40$; and $0 \leq y$ (atomic %) $\leq 30$.

In this alloy system, a phase separation into a phase with higher manganese composition and a phase with lower manganese composition takes place. Therefore, the phase (region 9A) of higher resistance in which manganese and element Q is oxidized, and the metal (M) phase (region 9B) of lower resistance with comparatively higher purity can be obtained by performing oxidization process.

Furthermore, spinodal decomposition or nucleation are accelerated at lower temperature by making the composition x in a range between 1% and 40% and using the thin film formation techniques, such as the sputtering method.

It is more desirable to make the composition x in a range between 5% and 20%. If the composition x is made within this range, the phase (region 9B) of lower resistance is dotted in the phase (region 9A) of higher resistance.

Alternatively, alloys expressed by the following formula may also be used as the material of the phase separation layer 9:

$$M_{100-x}Fe_x$$

where element M is at least one of molybdenum (Mo), magnesium (Mg), calcium (Ca), titanium (Ti), zirconium (Zr), niobium (Nb), hafnium (Hf), tantalum (Ta), boron (B), aluminum (Al), and silicon (Si). Further, it is desirable that the following conditions are satisfied:

$1 \leq x$ (atomic %) $\leq 50$.

In this alloy system, a phase separation into a phase with higher iron composition and a phase with lower iron composition takes place. Therefore, the phase (region 9A) of higher resistance in which element M is oxidized, and the iron (Fe) phase (region 9B) of lower resistance with comparatively higher purity can be obtained by performing oxidization process. It is because since the oxide free energy of formation of element M is smaller than that of iron (Fe), the element M tends to be oxidized more than iron (Fe), as mentioned above about Table 1.

Furthermore, spinodal decomposition or nucleation are accelerated at lower temperature by making the composition x in a range between 1% and 40% and using the thin film formation techniques, such as the sputtering method.

It is more desirable to make the composition x in a range between 5% and 20%. If the composition x is made within this range, the phase (region 9B) of lower resistance is dotted in the phase (region 9A) of higher resistance.

Alternatively, alloys expressed by the following formula may also be used as the material of the phase separation layer 9:

$$M_{100-x}Ni_x$$

where element M is at least one of molybdenum (Mo), magnesium (Mg), tungsten (W), titanium (Ti), zirconium (Zr), niobium (Nb), hafnium (Hf), tantalum (Ta), boron (B), aluminum (Al), and silicon (Si).

Further, it is desirable that the following conditions are satisfied:

$1 \leq x$ (atomic %) $\leq 50$.

In this alloy system, a phase separation into a phase with higher nickel composition and a phase with lower nickel composition takes place. Therefore, the phase (region 9A) of higher resistance in which element M is oxidized, and the nickel (Ni) phase (region 9B) of lower resistance with comparatively higher purity can be obtained by performing oxidization process. It is because since the oxide free energy of formation of element M is smaller than that of nickel (Ni), the element M tends to be oxidized more than nickel (Ni), as mentioned above about Table 1.

Furthermore, spinodal decomposition or nucleation are accelerated at lower temperature by making the composition x in a range between 1% and 40% and using the thin film formation techniques, such as the sputtering method.

It is more desirable to make the composition x in a range between 5% and 20%. If the composition x is made within this range, the phase (region 9B) of lower resistance is dotted in the phase (region 9A) of higher resistance.

Alternatively, alloys expressed by the following formula may also be used as the material of the phase separation layer 9:

$$M_{100-x}Co_x$$

where element M is at least one of molybdenum (Mo), magnesium (Mg), tungsten (W), titanium (Ti), zirconium (Zr), niobium (Nb), hafnium (Hf), tantalum (Ta), boron (B), aluminum (Al), chromium (Cr) and vanadium (V).

Further, it is desirable that the following conditions are satisfied:

$1 \leq x$ (atomic %) $\leq 50$.

In this alloy system, a phase separation into a phase with higher cobalt composition and a phase with lower cobalt composition takes place. Therefore, the phase (region 9A) of higher resistance in which element M is oxidized, and the cobalt (Co) phase (region 9B) of lower resistance with comparatively higher purity can be obtained by performing oxidization process.

It is because since the oxide free energy of formation of element M is smaller than that of cobalt (Co), the element M tends to be oxidized more than cobalt (Co), as mentioned above about Table 1.

Furthermore, spinodal decomposition or nucleation are accelerated at lower temperature by making the composition x in a range between 1% and 40% and using the thin film formation techniques, such as the sputtering method.

It is more desirable to make the composition x in a range between 5% and 20%. If the composition x is made within this range, the phase (region 9B) of lower resistance is dotted in the phase (region 9A) of higher resistance.

On the other hand, in order to form GP zone, aluminum (Al)-copper (Cu) alloy, aluminum (Al)-silver (Ag) alloy, aluminum (Al)-zinc (Zn)-magnesium (Mg) alloy, etc. can be used.

In the base material alloy of the phase separation layer 9 explained above, in order to control the amount of oxygen absorption and to control the particle diameter of spinodal decomposition or a precipitated phase, an addition of the elements, such as chromium (Cr), titanium (Ti), zirconium (Zr), hafnium (Hf), molybdenum (Mo), tin (Sn), lithium (Li), and zinc (Zn) by few atomic % may be carried out.

Moreover, the material which contains two or more sorts of the base materials can be used.

Alternatively, a base material which induce a solid-phase separation such as spinodal decomposition, and an alloy which does not produce a separation in a solid phase can be laminated.

Thus, an insulating phase and an electric conduction phase can be uniformly formed in a predetermined ratio by the phase separation in a solid phase, such as spinodal decomposition.

Moreover, it becomes possible to achieve an improvement in the breakdown voltage of the phase separation layer 9 by laminating an insulating phase which consists of metallic elements different from the above-mentioned insulated phase.

Moreover, generation of pinholes decreases sharply by laminating two or more sorts of different base materials. A base material accompanied by the phase separation such as spinodal decomposition, and an alloy without phase separation can be laminated.

Figure 10:
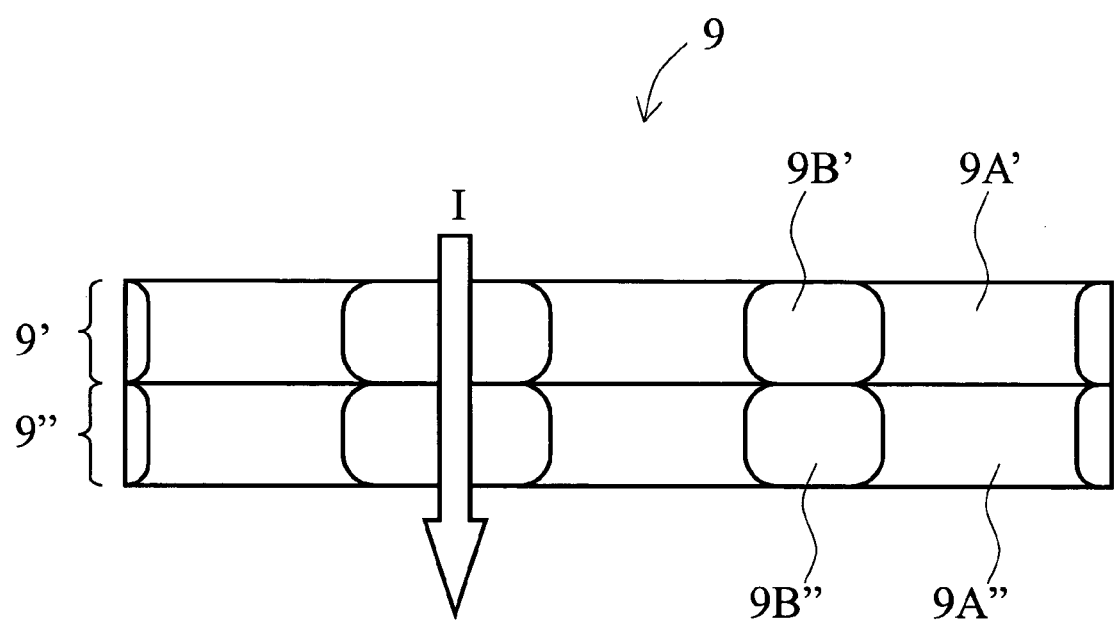
FIG. 10 is a schematic diagram which illustrates the cross-sectional structure of the phase separation layer 9 which has lamination structure.

FIG. 10 is a schematic diagram which illustrates the cross-sectional structure of the phase separation layer 9 which has a laminated structure. That is, the phase separation layer 9 of this example has the structure which laminated a first phase separation layer 9' and a second phase separation layer 9." The first phase separation layer 9' has the region 9A' of higher resistance, and the regions 9B' of lower resistance. The second phase separation layer 9" has the region 9A" of higher resistance, and the regions 9B" of lower resistance.

The average size of the regions 9B' is larger than that of regions 9B", and these regions are formed so that it may overlap mostly. Such structure can be formed by appropriately changing the composition of the base material of the first phase separation layer 9' and the second phase separation layer 9", or by changing the kind of the base material. That is, the sizes of the separated phases formed by the phase separation are controllable by changing the composition of the base materials or kind of the base materials of the upper and lower layers.

For example, on a phase separation layer 9" which consists of a material excellent in spinodal decomposition nature which was mentioned above, a phase separation layer 9' which includes an oxide (or nitride, boride, carbide) of elements which is easy to form crystalline state, such as chromium (Cr), tantalum (Ta), niobium (Nb), boron (B), germanium (Ge), tungsten (W), molybdenum (Mo), zirconium (Zr), titanium (Ti), vanadium (V), cobalt (Co), iron (Fe), nickel (Ni), and silicon (Si), can be laminated By employing such a laminated structure, it becomes possible to improve the crystallinity of the magnetic layer formed on the phase separation layer in addition to be able to the form the high electric conduction phase by spinodal decomposition, and improvement in the soft magnetic characteristic can be obtained.

Or a phase separation layer which consists of a material excellent in the spinodal decomposition nature containing a magnetic oxide (or nitride, boride, carbide), such as cobalt (Co), iron (Fe), and nickel (Ni), and a phase separation layer which consists of an oxide (or nitride, boride, carbide) of non-magnetic element can be laminated. The latter non-magnetic phase separation layer acts as a magnetic coupling interception layer, and thus, a reproducible current constriction effect and a magnetic coupling interception effect can be obtained simultaneously.

Moreover, if the spinodal decomposition takes place in either the upper layer or the lower layer when a separation process is carried out for such a lamination structure, the separated phases (D1, D2) may serve as a "trigger" for the spinodal decomposition in the other layer.

Consequently, it becomes possible to form the regions 9A' and 9A" formed in the upper and lower layers 9' and 9" so that they are overlapped in a thickness direction.

Although the phase separation layer of two-layered structure is illustrated in FIG. 10, the present invention is not limited to this example but may have a structure which has three or more phase separation layers laminated each other. Furthermore, the boundary of each layer may not necessarily be clear and may have a structure where composition is modulating continuously along the direction of thickness of the phase separation layers.

Furthermore, the phase separation layer 9 may be inserted in the magnetically pinned layer 4, the magnetically free layers 6, the substrate electrode 1 and/or the upper electrode 8 in order to improve the magnetic characteristic, to adjust the resistance, or to improve the crystallinity.

For example, a structure like magnetically pinned layer 4/phase separation layer 9/magnetically pinned layer 4', and magnetically pinned layer 4/phase separation layer 9/magnetically pinned layer 4' can be mentioned.

On the other hand, in order to form the region 9A of relatively high resistance by raising resistance of the separated phase, the process of nitridation, fluoridation or carbonization can also be used instead of oxidization in the phase separation layer 9. That is, when the electric resistance of the separated phase can be raised by making it react with nitrogen (N), fluoride (F), or carbon (C), the process of nitridation, fluoridation or carbonization can be used.

(Second Embodiment)

Next, as a second embodiment of the invention, the magnetoresistance effect element where the phase separation layer 9 is provided either in a magnetically pinned layer, a magnetically free layer or an intermediate layer, or between the electrode and a ferromagnetic film, and which contains a magnetic coupling interception layer which is adjoining the above-mentioned phase separation layer, will be explained.

In the magnetoresistance effect element of this embodiment, the magnetic coupling interception layer 5A can be provided at least one side of the phase separation layer 9 as illustrated in FIG. 1. The magnetic coupling interception layer 5A has the role which intercepts certainly the magnetic coupling between the magnetically pinned layer 4 and the magnetically free layer 6.

That is, even if the magnetic coupling between the magnetically pinned layer 4 and the magnetically free layer 6 cannot fully be intercepted only with the phase separation layer 9, the magnetic coupling can be certainly intercepted by providing the magnetic coupling interception layer 5A.

Such magnetic coupling interception layer 5A is especially effective when an alloy system expressed by the formula $Q_x(Ni_{100-y}(Fe_{100-z}Co_z)_y)_{100-x}$ where Q denotes a noble metal element is used as the base material of the phase separation layer 9. That is, when a phase separation takes place in this alloy system to form the region 9A, magnetism may remain a little in the region 9A oxidized inadequately. In such a case, in order to intercept the magnetic coupling between the neighboring magnetically free layers 6 and the magnetically pinned layers 4, the magnetic coupling interception layer 5A is especially effective.

As a material of the magnetic coupling interception layer 5A, one of copper (Cu), gold (Au), silver (Ag), a rhenium (Re), osmium (Os), ruthenium (Ru), iridium (Ir), palladium (Pd), chromium (Cr), magnesium (Mg), aluminum (Al), rhodium (Rh) and platinum (Pt) can be used.

As for the thickness of the magnetic coupling interception layer 5A, it is desirable that it is thick enough to fully intercept the magnetic coupling between the magnetically pinned layers 4 and the magnetically free layers 6 through the phase separation layer 9. That is, since the magnetism may remain in the phase separation layer 9 as mentioned above, it is required for either of the magnetic coupling interception layers 5 provided in the upper and lower sides to have the thickness which can intercept the magnetic coupling certainly.

From this viewpoint, since this magnetic coupling will not be intercepted and the magnetization direction of the magnetically free layer 6 or the magnetically pinned layer 4 may be disturbed if the thickness of the magnetic coupling interception layer 5A is less than 0.5 nm, it is desirable to set the thickness of the magnetic coupling interception layer 5A to 0.5 nm or more.

However, if the thickness of the magnetic coupling interception layer 5A becomes thick, the current narrowed in the phase separation layer 9 will spread again in the magnetic coupling interception layer 5A, and the current narrowed effect will decrease. From this viewpoint, as for the thickness of the magnetic coupling interception layer 5A, it is desirable that it is 5 nm or less.

In order to intercept the magnetic coupling and to control the spread of the current, it is more desirable to set the thickness of the magnetic coupling interception layer 5A in a range between 1 nm and 3 nm. The magnetic coupling interception layer may be provided in the upper and lower sides of the phase separation layer.

Alternatively, the magnetic coupling interception layer 5A may be provided in the upper side of the phase separation layer, and the interface adjustment layer 5B may be provided in the lower side of the phase separation layer. The interface adjustment layer 5B has a role of a buffer layer which controls grain size and crystallinity of the phase separation layer 9 and the magnetically free layer 6 formed thereon.

In order for prevent the spreading of the sense current, it is desirable to make the thickness of the interface adjustment layer 5B thin. For this reasons, as for the thickness of the interface adjustment layer 5B, it is desirable that it is less than 1 nm, and it is more desirable that it is 0.25 nm or less.

The interface adjustment layer 5B does not necessarily need to be a continuous film, and may be partially missing along the film plane. That is, the interface adjustment layer 5B can be a discontinuous thin film, as long as it has the buffering effect over the magnetically free layer 6.

On the other hand, as another laminated structure, the feature as above mentioned above can also be provided in the magnetoresistance effect element having the so-called "dual spin valve structure" where the magnetically pinned layers are provided in the upper and lower sides of the magnetically free layer, respectively.

The metal magnetic material which includes nickel (Ni), iron (Fe) or cobalt (Co) as a main component can be used as a material of the magnetically free layer 6 of the magnetoresistance effect element of this embodiment. It is required that the material of the free layer 6 should have the good soft magnetic characteristic to increase the sensitivity of a magnetic sensor and to decrease a Barkhausen noise.

Also, it is desirable to grow the magnetically free layer 6 in the direction of a crystal axis [111] which is the stacking direction of a closest-packed atomic plane of a face-centered cubic lattice.

On the other hand, the magnetically free layer 6 may have a body-centered cubic lattice partially, or may have the crystal structure of a hexagonal close-packed lattice or others.

Moreover, the so-called "synthetic antiferromagnetic structure" where the magnetic material of two or more layers are combined in an antiferromagnetic fashion through non-magnetic materials, such as a ruthenium (Ru), may be incorporated in the magnetically pinned layer 4 of the magnetoresistance effect element of this embodiment.

(Third Embodiment)

Next, the magnetoresistance effect element where the phase separation layer is provided between the magnetically free layer and the electrode will be explained as the third embodiment of the invention.

Figure 11:
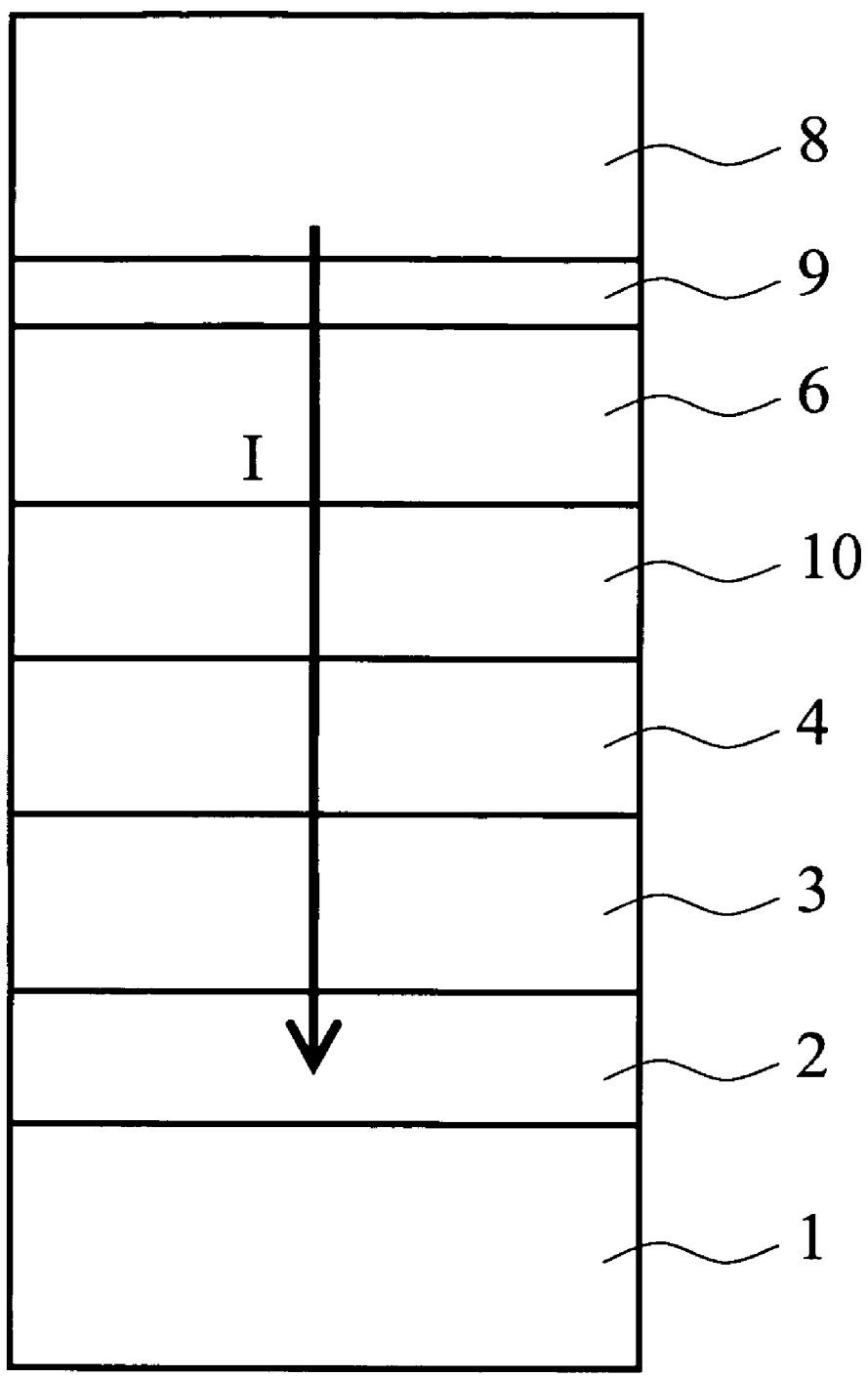
FIG. 11 is a schematic diagram which illustrates the cross-sectional structure of the magnetoresistance effect element according to the embodiment of the invention.

FIG. 11 is a schematic diagram which illustrates the cross-sectional structure of the magnetoresistance effect element according to this embodiment. The same reference numerals are given to the same elements as what were mentioned above with reference to FIG. 1 through FIG. 10 about this figure, and detailed explanation will be omitted.

In this example, the non-magnetic metal layer 10 is provided between the magnetically pinned layer 4 and the magnetically free layer 6. This non-magnetic metal layer has a role to intercept the magnetic coupling between the magnetically pinned layer 4 and the magnetically free layer 6.

And the phase separation layer 9 is provided between the magnetically free layer 6 and the upper electrode 8. With regard to this phase separation layer 9, the layer same as what was mentioned above about the first embodiment can be used. That is, by providing such a phase separation layer 9, a current narrowing effect is acquired by the phase separation structure formed by mechanisms, such as spinodal decomposition and GP zone formation.

Thus, if the phase separation layer 9 is provided between the electrode 8 which adjoins the magnetically free layer 6 and the magnetically free layer 6, the current which flows from the electrode to the magnetically free layer 6 is appropriately narrowed, and the element resistance is made moderately high, and thus, a big magnetoresistance change can be obtained.

In the invention, the first embodiment through the third embodiment may be combined appropriately. That is, the phase separation layer 9 may be provided between the magnetically pinned layer 4 and the magnetically free layer 6 as mentioned above about the first embodiment, the magnetic coupling interception layer 5A may be provided as mentioned above about the second embodiment, and the phase separation layer 9 may be provided between the electrode which adjoins the magnetically free layer and the magnetically free layer as the third embodiment.

Then, it is possible to make each current narrowing effect multiply and to obtain still higher element resistance and the change of magnetoresistance.

(Fourth Embodiment)

Figure 12:
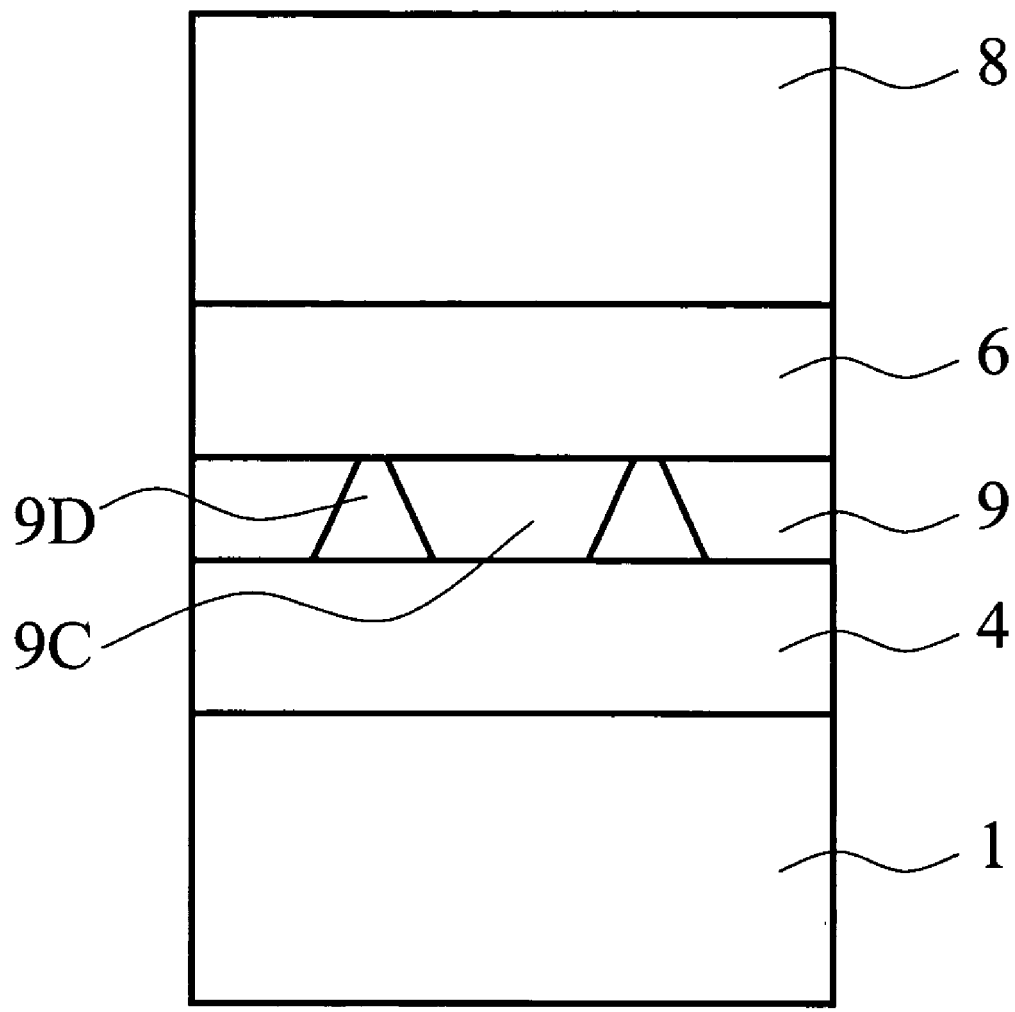
FIG. 12 is a schematic diagram which illustrates the cross-sectional structure of the magnetoresistance effect element according to the embodiment of the invention.

Next, a BMR (ballistic magnetoresistance effect) type magnetoresistance effect element where a magnetically pinned layer and a magnetically free layer are connected by small magnetic regions will be explained as the fourth embodiment of the invention. FIG. 12 is a schematic diagram showing the section structure of the principal part of the magnetoresistance effect element according to this embodiment.

That is, the magnetoresistance effect element of this embodiment has the structure where the first magnetic layer 4, the phase separation phase 9, the second magnetic layer 6, and the upper electrode 8 are laminated in this order, on the substrate (electrode) 1.

One the first and the second magnetic layers 4 and 6 acts as the magnetically pinned layer, and the other acts as the magnetically free layer. The phase separation layer 9 has the non-magnetic matrix 9C and the magnetic regions 9D which are dotted in the non-magnetic matrix 9C. The non-magnetic matrix 9C consists of material which does not have magnetism substantially. The magnetic regions 9D consist of a material which has magnetism.

As mentioned above about the first embodiment through the third embodiment, the non-magnetic matrix 9C and the magnetic regions 9D are formed by the phase separation of the base material with the phase separation mechanism such as spinodal decomposition and others.

Typically, the alloy of magnetic element and a non-magnetic element can be used as the base material. As the magnetic element, iron (Fe), cobalt (Co) or nickel (Ni) may be used, for example. Such a structure where the first and the second magnetic layers 4 and 6 are connected by the magnetic regions 9D is called a "magnetic nanocontact" or "magnetic point contact", and the big magnetoresistance effect by BMR (ballistic magnetoresistance) is obtained.

As the "magnetic nanocontact", two nickel (Ni) needles which are in contact at their tips each other is disclosed by N. Garcia and M. Munoz, and Y.-W. Zhao, Physical Review Letters, vol.82, p 2923 (1999), and by J. J. Versluijs, M. A. Bari and J. M. D. Coey, Physical Review Letters, vol.87, p 26601 (2001), for example. These magnetic nanocontact structures are reported to show 100% or more of magnetoresistance effect.

The manufacturing method of these magnetic nanocontacts is to make the tips of two ferromagnetic materials processed in the shape of needlelike or triangle associate.

In contrast, according to this embodiment, the structure where the small magnetic regions 9D are dotted in the non-magnetic matrix 9C can be easily formed by utilizing a phase separation with mechanisms, such as spinodal decomposition. And these small magnetic regions 9D show the big magnetoresistance effect by BMR by acting as a "magnetic nanocontact" or "magnetic point contact" between the first and the second magnetic layers 4 and 6.

As the material of the phase separation layer 9, alloys expressed by the following formula may be used:

$$M_{100-x}Fe_x$$

where element M is at least one of molybdenum (Mo), magnesium (Mg), calcium (Ca), titanium (Ti), zirconium (Zr), niobium (Nb), hafnium (Hf), tantalum (Ta), boron (B), aluminum (Al) and silicon (Si). Further, it is desirable that the following conditions are satisfied:

$1 \leq x$ (atomic %) $\leq 50$.

In this alloy system, a phase separation into a phase with higher iron composition and a phase with lower iron composition takes place. Therefore, the non-magnetic matrix 9C in which element M is mainly oxidized, and the magnetic regions 9D with comparatively higher purity of iron (Fe) can be obtained by performing oxidization process.

Furthermore, spinodal decomposition or nucleation are accelerated at lower temperature by making the composition x in a range between 1% and 40% and using the thin film formation techniques, such as the sputtering method.

It is more desirable to make the composition x in a range between 5% and 20%. If the composition x is made within this range, the magnetic regions 9D are dotted in the non-magnetic matrix 9C can be easily obtained.

Alternatively, alloys expressed by the following formula may also be used as the material of the phase separation layer 9:

$$M_{100-x}Ni_x$$

where element M is at least one of molybdenum (Mo), magnesium (Mg), tungsten (W), titanium (Ti), zirconium (Zr), niobium (Nb), hafnium (Hf), tantalum (Ta), boron (B), aluminum (Al) and silicon (Si).

Further, it is desirable that the following conditions are satisfied:

$1 \leq x$ (atomic %) $\leq 50$.

In this alloy system, a phase separation into a phase with higher nickel composition and a phase with lower nickel composition takes place. Therefore, the non-magnetic matrix 9C in which element M is mainly oxidized, and the magnetic regions 9D with comparatively higher purity of nickel (Ni) can be obtained by performing oxidization process.

Alternatively, alloys expressed by the following formula may also be used as the material of the phase separation layer 9:

$$M_{100-x}Co_x$$

where element M is at least one of molybdenum (Mo), magnesium (Mg), tungsten (W), titanium (Ti), zirconium (Zr), niobium (Nb), hafnium (Hf), tantalum (Ta), boron (B), aluminum (Al), chromium (Cr) and vanadium (V).

Further, it is desirable that the following conditions are satisfied:

$1 \leq x$ (atomic %) $\leq 50$.

In this alloy system, a phase separation into a phase with higher cobalt composition and a phase with lower cobalt composition takes place. Therefore, the non-magnetic matrix 9C in which element M is mainly oxidized, and the magnetic regions 9D with comparatively higher purity of cobalt (Co) can be obtained by performing oxidization process.

In the above, the first through fourth embodiments of the invention have been explained. The magnetoresistance effect of the present invention will now be described in more detail referring to the examples.

FIRST EXAMPLE

First, the magnetoresistance effect elements formed as a first example of the invention using the spinodal decomposition of aluminum (Al)-silver (Ag) system will be explained.

In this example, the magnetoresistance effect elements as shown in FIG. 1 were manufactured. And oxidization process was performed to the AlAg alloy as a phase separation layer 9.

The thickness and material of each layer which constitutes the magnetoresistance effect elements of this example are as the following:

Si (1)/5 nm Ta (2)/200 nm Cu (2)/10 nm PtMn (3)/3 nm CoFe (4)/0.2 nm Cu (5A)/0.8 nm AlAg (9)/0.2 nm Cu (5B)/3 nm CoFe (6)/2 nm Ta (7)/200 nm Cu (8).

In the above, the reference numerals expressed in FIG. 1 are given to the each corresponding layer with parenthesis.

$SiO_2$ layer of a thickness of about 100 nm was formed on the silicon substrate 1 by a thermal oxidation treatment. AlAg used for the base material of the phase separation layer 9 is expressed by the formula $Al_{100-x}Ag_x$ where the composition x was set to 0, 5, 10, 20, and 40 atomic %.

DC magnetron sputtering method was used as the method to form films. In the deposition process, the chamber was evacuated at down to a background pressure below $10^{-5}$ Pa (Pascal), and the deposition was performed at the rate of 0.02–0.1 nm per second. The upper electrode 8 was made into substantially round shape whose diameter was 1 micrometer.

The oxidization process was performed by irradiating an oxygen radical after the film forming process of the phase separation layer 9. Further, a heat treatment was performed at 270 degrees centigrade for 10 hours under the environment where a magnetic field of 5 kOe (oersted) was applied.

On the other hand, as comparative samples, Cu film of 3 nm thick was used instead of the AlAg alloy as the material of the phase separation layer 9.

The following results were obtained when the magnetoresistance effect MR and the area resistance RA of the magnetoresistance effect element of this example using $Al_{90}Ag_{10}$ (x=10) and a comparative sample were measured:

TABLE 2

| Material of the phase separation layer 9 | MR, % | RA, $\Omega\mu m^2$ |
| --- | --- | --- |
| Cu | 0.5 | 0.08 |
| $Al_{90}Ag_{10}$ (with oxidization process) | 6.0 | 0.25 |

For the samples using $Al_{90}Ag_{10}$ alloy as the base material of the phase separation layer 9, the crystallinity was investigated, respectively by a cross-sectional TEM (transmission electron microscopy) observation.

FIGS. 9A and B are the figures showing the typical schematic diagram of a cross-sectional TEM image and the profile of the elemental analysis by nano-EDX for the sample with oxidization process as mentioned above.

In the case of the sample without oxidization process, spinodal decomposition into a separated structure including an aluminum phase and a silver phase of about 1.5 nm width was observed indefinitely. On the other hand, in the case of the sample with oxidization process, as shown also in FIGS. 9A and 9B, the phase separation into an aluminum phase of 9 nm width and a silver phase of 1.5 nm width by the spinodal decomposition was clearly seen. Further, as a result of performing oxygen analysis for each phase, it was also confirmed that almost all oxygen existed in the aluminum phase.

The inventors fabricated the following laminated thin films on a silicon substrate, in order to observe the state of the phase separation of the film of $Al_{90}Ag_{10}$ (atomic %) in this example by plane TEM observation:

Si substrate (1)/5 nm Ta (1)/200 nm Cu (1)/5 nm Ta (2)/2 nm Ru (2)/15 nm PtMn (3)/4 nm CoFe (4)/1 nm Ru (4)/4 nm CoFe (4)/0.2 nm Cu (5B)/50 nm AlAg (9).

Thus, after giving the same heat treatment as the magnetoresistance effect element films to this sample, plane TEM observation and chemical composition analysis by nano-EDX were performed.

Figure 13:
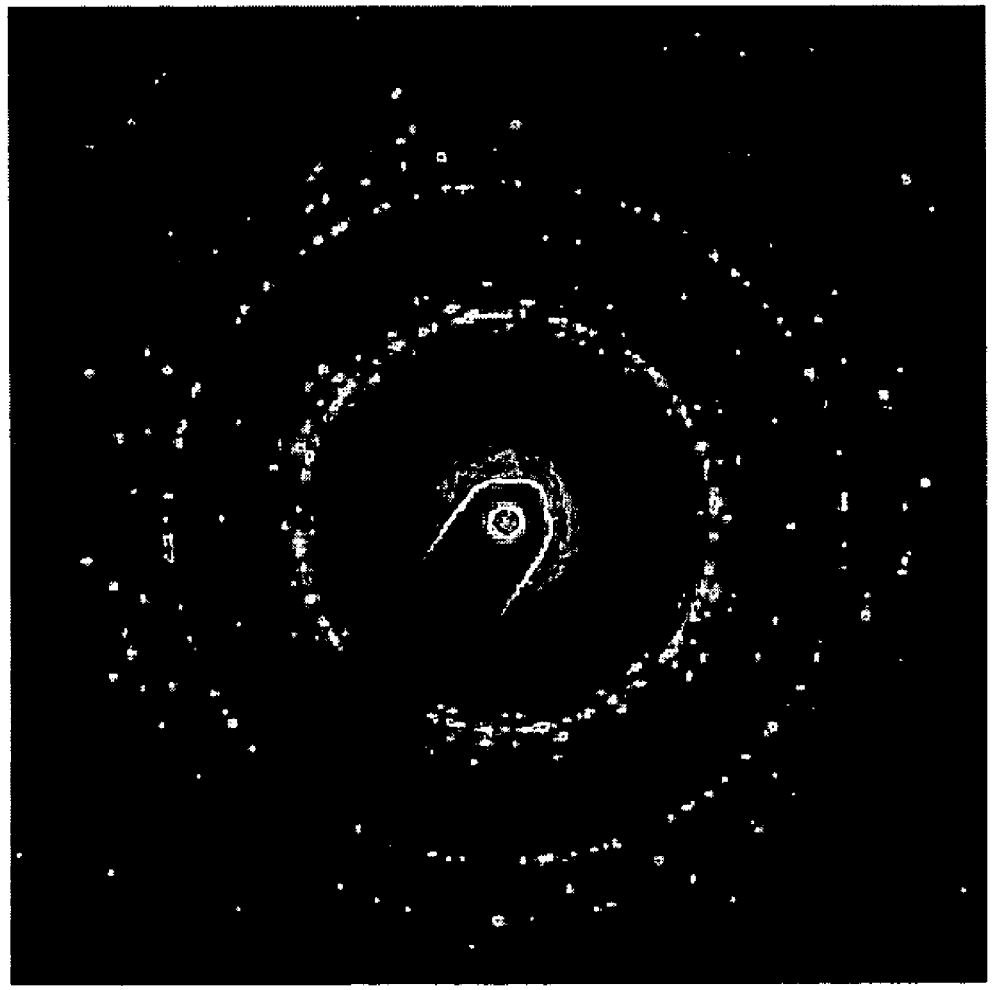
FIG. 13 is a photograph showing the result of TEM observation.

FIG. 13 is a photograph showing the result of TEM observation. That is, this figure is the restricted field electron diffraction pattern obtained from a range of 1 micrometer in diameter of the surface of the AlAg layer. It turns out that the AlAg layer consists of other numbers of crystal grains since the Debye ring corresponding to a polycrystalline structure is seen.

Figure 14:
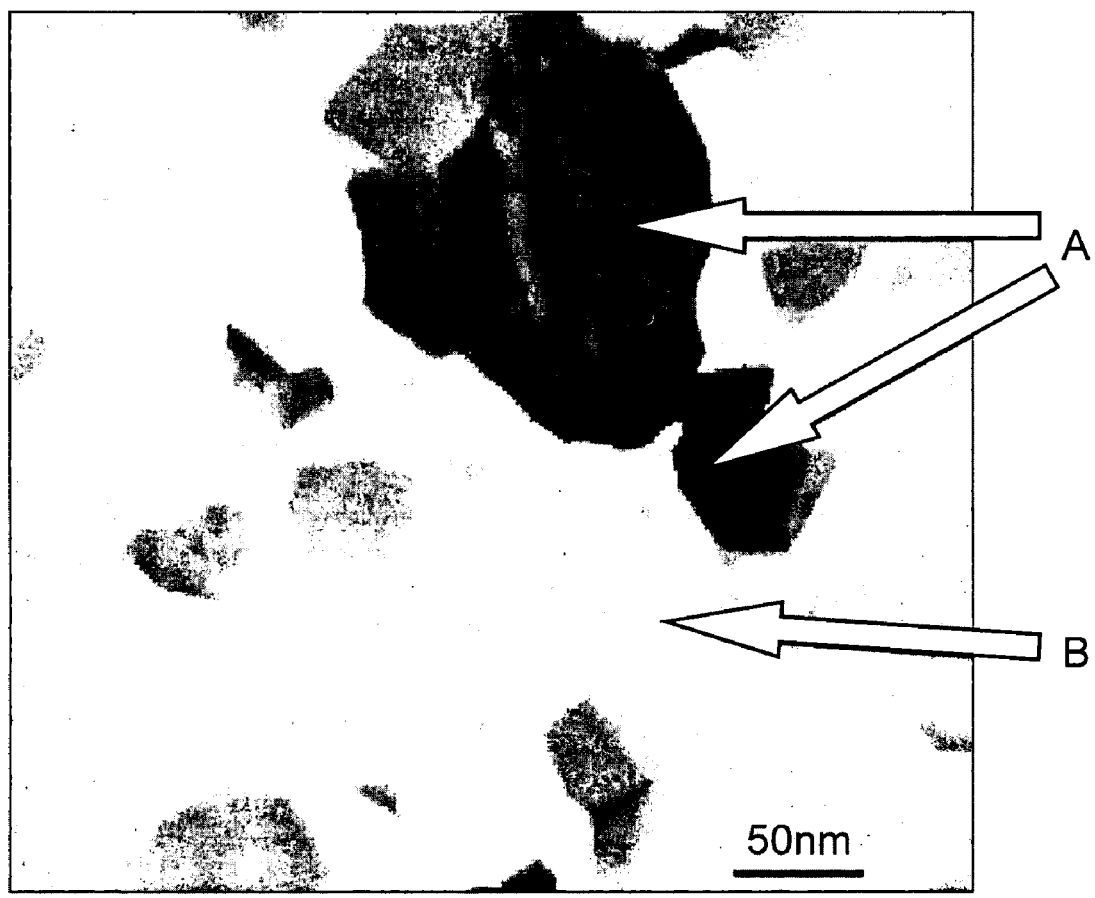
FIG. 14 is a photograph showing the result of TEM observation.

FIG. 14 is the TEM image of the AlAg layer. The phase separation into the black granular object A whose particle diameter is 30–200 nm and the white granular object B whose particle diameter is 50 nm or less is observed.

Figure 15:
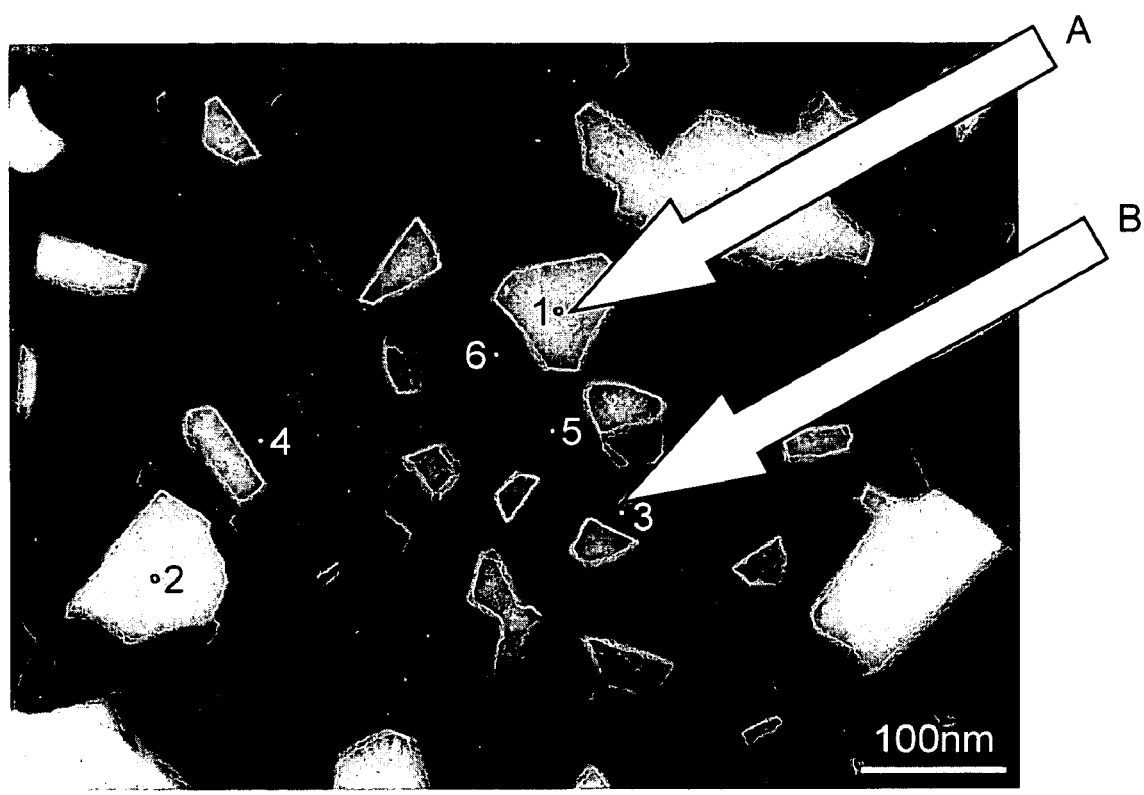
FIG. 15 is the HAADF (high angle annular dark field) image obtained by TEM observation about the same sample.

FIG. 15 is the HAADF (high angle annular dark field) image obtained by the TEM observation for the same sample. In this image, black portions correspond to the granular object B in FIG. 14, and white portions correspond to the granular object A in FIG. 14. In these TEM images, chemical composition analysis was performed by nano-EDX for the granular object A and the granular object B, respectively. Consequently, it turns out that the granular object A is Ag-rich phase which is $Al_{40}Ag_{60}$ (atomic %) and the granular object B is Al-rich phase which is $Al_{95}Ag_5$ (atomic %). That is, it was seen that the base material $Al_{90}Ag_{10}$ has been decomposed into the Ag-rich granular objects A and the Al-rich granular objects B.

Figure 16:
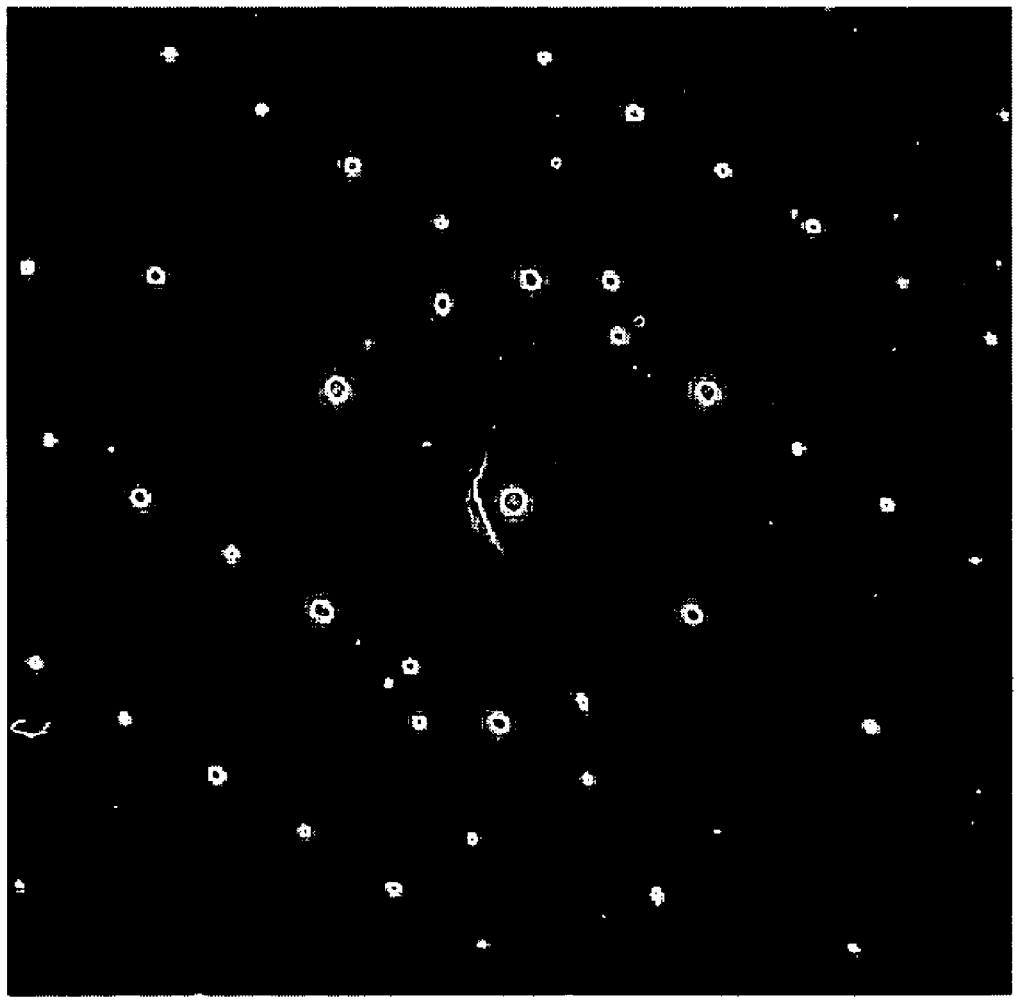
FIG. 16 is the restriction field electron diffraction pattern obtained from Ag-rich granular object A.

FIG. 16 is the restriction field electron diffraction pattern obtained from the Ag-rich granular object A. The diffraction pattern having clear diffraction spots arranged regularly was obtained, and thus, it turns out that the granular object A is consisted of an almost single crystal grain and the crystallinity is also good.

Thus, it was confirmed that the phase separation layer was divided into Ag-rich phase D2 (region 9B) with high conductivity and Al-rich oxide insulating phase D1 (region 9A) which was made to close to $Al_2O_3$ by spinodal decomposition and oxidization process. Moreover, it was also seen by plane TEM observation that each phase was finely distributed within a film plane by spinodal decomposition, and the occupancy area of Ag phase was just over or below about 10%. That is, FIG. 15 shows that the area the Ag-rich granular objects A occupy was about 10% of the whole.

On the other hand, when $Al_{80}Ag_{20}$ (x=20) alloy was used as the base material, the following result was obtained as the magnetoresistance effect MR and area resistance RA after performing oxidization process:

TABLE 3

| Material of the phase separation layer 9 | MR, % | RA, $\Omega\mu m^2$ |
|---|---|---|
| $Al_{80}Ag_{20}$ (with oxidation process) | 4.5 | 0.17 |

In the case of the AlAg alloy, if the silver content is less than 1%, since the area of the high electric conduction phase is too small, the resistance RA per 1 square micrometer will increase to 1 $\Omega\mu m^2$, and an increase of noise and a decrease of the frequency response will arise resulting from the high resistance nature like the case of TMR.

On the other hand, if the composition of Ag exceeds 40%, since the region of a high electric conduction phase becomes too large, the current narrowing effect will not be acquired any longer, but the low R and low AR same as the case where metal intermediate layers, such as Cu, are used will arise.

As for the composition x, it is desirable that it is in a range between 1–40 atomic % Ag, and the optimum composition can be determined appropriately according to the magnetoresistance effect MR and resistance R which are needed.

The inventors have investigated the case where magnesium (Mg), silicon (Si) and manganese (Mn) are used instead of aluminum (Al) for the alloy used for the base material. As a result, although some differences were seen at MR and R, the same tendency as the case of aluminum was seen in the result and the texture in cross-sectional TEM observation.

Furthermore, as illustrated in FIG. 10, in the case where the phase separation layer has a combination of the Al—Ag alloy phase separation layer and the phase separation layer formed from the base material of Cr—Cu alloy, Ag contained in the Al—Ag alloy and Cu contained in the Cr—Cu alloy had a act of current path, and the same effect was acquired.

SECOND EXAMPLE

Next, the magnetoresistance effect elements using the spinodal decomposition of aluminum (Al)-gold (Au) system will be explained as the second example of the invention.

Also in this example, the magnetoresistance effect elements shown in FIG. 1 were fabricated. However, the magnetically pinned layer 4 was made into the so-called "synthetic structure" in this example.

Moreover, the manufacturing method of this example is almost the same as that mentioned above about the first example. However, the phase separation layer 9 was formed, irradiating the ion beam containing oxygen ion on a substrate simultaneously with films formation.

The thickness and material of each layer which constitutes the magnetoresistance effect element are as the following:

Si substrate (1)/5 nm Ta (2)/200 nm Cu (2)/5 nm $(Ni_{80}Fe_{20})_{78}Cr_{22}$ (2)/10 nm PtMn (3)/2.5 nm CoFe(4)/0.9 nm Ru (4)/2.5 nm CoFe (4)/0.2 nm Cu (5A)/0.8 nm AlAu (9)/0.2 nm Cu (5B)/3 nm CoFe (6)/2 nm Ta (7)/200 nm Cu (8).

In the above, the reference numerals expressed in FIG. 1 are given to the each corresponding layer with parenthesis.

AlAu used for the base material of the phase separation layer 9 is expressed by the formula $Al_{100-x}Au_x$ where the composition x was set to 0, 5, 10, 20, and 40 atomic %.

When $Al_{90}Au_{10}$ (x=10) alloy was used as the base material, the following result was obtained as the magnetoresistance effect MR and area resistance RA after performing oxidization process:

TABLE 4

| Material of the phase separation layer 9 | MR, % | RA, $\Omega\mu m^2$ |
|---|---|---|
| $Al_{90}Au_{10}$ (with oxidation process) | 7.5 | 0.18 |

As a result of a cross-sectional TEM observation, in the case of the sample without oxidization process, spinodal decomposition into a separated structure including an aluminum phase and a gold phase of about 1.5 nm width was observed indefinitely. On the other hand, in the case of the sample with oxidization process the phase separation into an aluminum phase and a gold phase of 1.5 nm width by the spinodal decomposition was clearly seen. Further, as a result of performing oxygen analysis for each phase, it was also confirmed that almost all oxygen existed in the aluminum phase.

Thus, it was confirmed that the phase separation layer was divided into Au-rich phase (region 9B) with high conductivity and Al-rich oxide insulating phase (region 9A) which was made to close to $Al_2O_3$ by spinodal decomposition and oxidization process. Moreover, it was also seen by plane TEM observation that each phase was finely distributed within a film plane by spinodal decomposition, and the occupancy area of Ag phase was just over or below about 10%.

On the other hand, when $Al_{80}Au_{20}$ (x=20) alloy was used as the base material, the following result was obtained as the magnetoresistance effect MR and area resistance RA after performing oxidization process:

TABLE 5

| Material of the phase separation layer 9 | MR, % | RA, $\Omega\mu m^2$ |
|---|---|---|
| $Al_{80}Au_{20}$ (with oxidation process) | 5.5 | 0.13 |

In the case of the AlAu alloy, if the gold content is less than 1%, since the area of the high electric conduction phase is too small, the resistance RA per 1 square micrometer will increase to 1 $\Omega\mu m^2$, and an increase of noise and a decrease of the frequency response will arise resulting from the high resistance nature like the case of TMR.

On the other hand, if the composition of Au exceeds 40%, since the region of a high electric conduction phase becomes too large, the current narrowing effect will not be acquired any longer, but the low R and low AR same as the case where metal intermediate layers, such as Cu, are used will arise.

As for the composition x, it is desirable that it is in a range between 1–40 atomic % Au, and the optimum composition can be determined appropriately according to the magnetoresistance effect MR and resistance R which are needed.

The inventors have investigated the case where magnesium (Mg), calcium (Ca), silicon (Si), germanium (Ge), boron (B), tantalum (Ta), tungsten (W), niobium (Nb), zirconium (Zr), titan (Ti), chromium (Cr), zinc (Zn), lithium (Li) and gallium (Ga) are used instead of aluminum (Al) for the alloy used for the base material. As a result, although some differences were seen at MR and R, the same tendency as the case of aluminum was seen in the result and the texture in cross-sectional TEM observation.

THIRD EXAMPLE

Next, the magnetoresistance effect elements using the spinodal decomposition of copper (Cu)-nickel (Ni)-iron (Fe) system will be explained as the third example of the invention.

Also in this example, the magnetoresistance effect elements shown in FIG. 1 were fabricated. However, the interface adjusting layer 5B was not provided, and the magnetically pinned layer 4 was made into the so-called "synthetic structure" in this example.

The thickness and material of each layer which constitutes the magnetoresistance effect element are as the following:

Si substrate (1)/5 nm Ta (2)/200 nm Cu (2)/5 nm $(Ni_{80}Fe_{20})_{78}Cr_{22}$ (2)/10 nm PtMn (3)/2.5 nm CoFe (4)/0.9 nm Ru (4)/2.5 nm CoFe (4)/0.8 nm CuNiFe (9)/2.0 nm Cu (5)/3 nm CoFe (6)/2 nm Ta (7)/200 nm Cu (8).

In the above, the reference numerals expressed in FIG. 1 are given to the each corresponding layer with parenthesis.

CuNiFe alloy used for the base material of the phase separation layer 9 is expressed by the formula $Cu_x(Ne_{100-y}Fe_y)_{100-x}$ where the composition x was set to 0.5, 1, 10, 20, 50 and 60 atomic % and the composition y was set to 0, 20, 50 and 70, respectively.

The magnetic coupling interception layer 5 which consists of 2.0 nm Cu was inserted between the phase separation layer 9 and the magnetization free layer 6. The thickness of the layer 5 is needed to be enough to intercept the magnetic coupling between the phase separation layers 9 which consist of the CuNiFe alloy and the magnetization free layers 6, and is desirably in a range between 1 and 3 nm.

The phase separation layer 9 was formed, irradiating the ion beam containing oxygen ion on a substrate simultaneously with films formation.

For comparison, the magnetoresistance effect elements which include the alloy layer of $Cu_{20}(Ni_{80}Fe_{20})_{80}$ (atomic %) was also fabricated instead of the phase separation layer 9 of the example.

After formation of the elements, magnetic field of 5 kOe was applied in the vacuum, and heat treatment of 10 hours was carried out at 300 degrees centigrade.

The magnetoresistance effect MR of the magnetoresistance effect element of this example was 3–10%, and the resistance R was 0.15–1.0 ohms except the case where composition x was set to 0.1 and 60, and composition y was set to 0.7. Thus, the good characteristics were obtained. On the other hand, in the case of the magnetoresistance effect elements where composition x was set to 5 and 60, and composition y was set to 70, it turned out that the MR was 0.5% or less, and the AΔR was also very small, and thus, they were not good for a practical use.

The inventors have investigated the cases where Au, Ag, Pt, Pd, Ir and Os were used respectively as a material of the magnetic interception layer 5 in stead of Cu, and have found that the almost same magnetic interception effect was obtained.

Moreover, on the other hand, in this example, it also turned out that degradation of the characteristic of a magnetoresistance effect element is hardly seen, even if the magnetization pinned layer 4 was oxidized a little.

On the other hand, in the case of the comparative magnetoresistance effect element which does not include the magnetic coupling interception layer 5, the magnetic field response of the magnetization free layer 6 was degraded under the influence of the phase separation layer 9 which had some magnetism, and therefore MR sensitivity fell.

The above results show that it becomes possible to offer the magnetoresistance effect element of the good characteristic by using the alloy of the composition region which realizes the spinodal decomposition and the oxidation of the Ni—Fe phase as the base material of the phase separation layer 9, and by providing the magnetic coupling interception layer 5.

Furthermore, the inventors have used the alloy system where Fe is replaced by Co in the above-mentioned formula and have obtained the similar results. That is, the magnetoresistance effect elements using the alloy system of the composition formula $Cu_x(Ni_{100-y}Co_y)_{100-x}$ have shown almost the same characteristics as the elements using $Cu_x(Ni_{100-y}Fe_y)_{100-x}$.

Furthermore, the same effect was acquired in the case where the phase separation layer was made by combining the $Cu_x(Ni_{100-y}Fe_y)_{100-x}$ phase separation layer and the phase separation layer using the Al—Ag alloy as a base material, as illustrated in FIG. 10.

FOURTH EXAMPLE

Next, the magnetoresistance effect element which comprises two phase separation layers will be explained as a fourth example of the invention.

Figure 17:
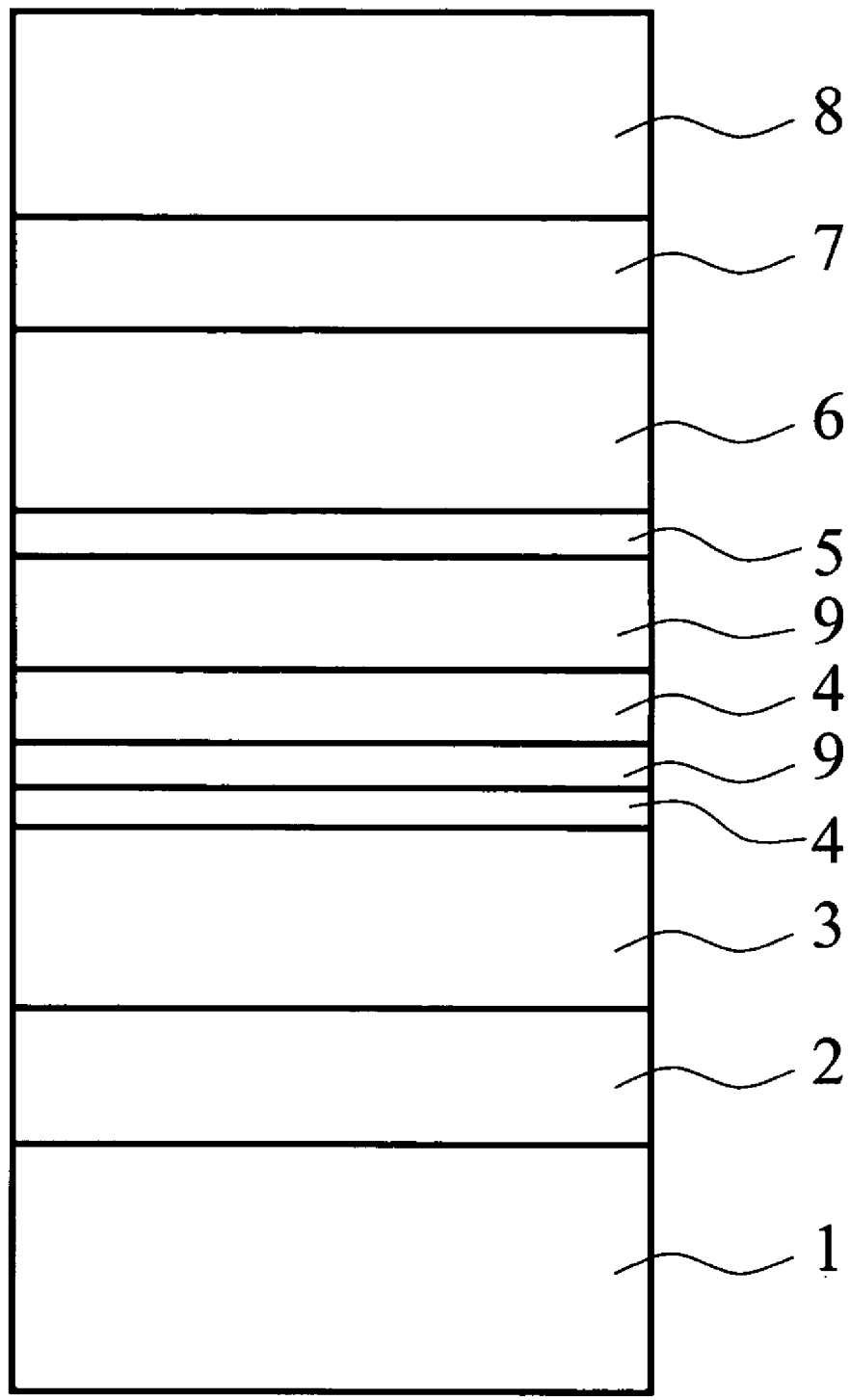
FIG. 17 is schematic diagram showing the cross-sectional structure of the magnetoresistance effect element of the example of the invention.
Figure 18:
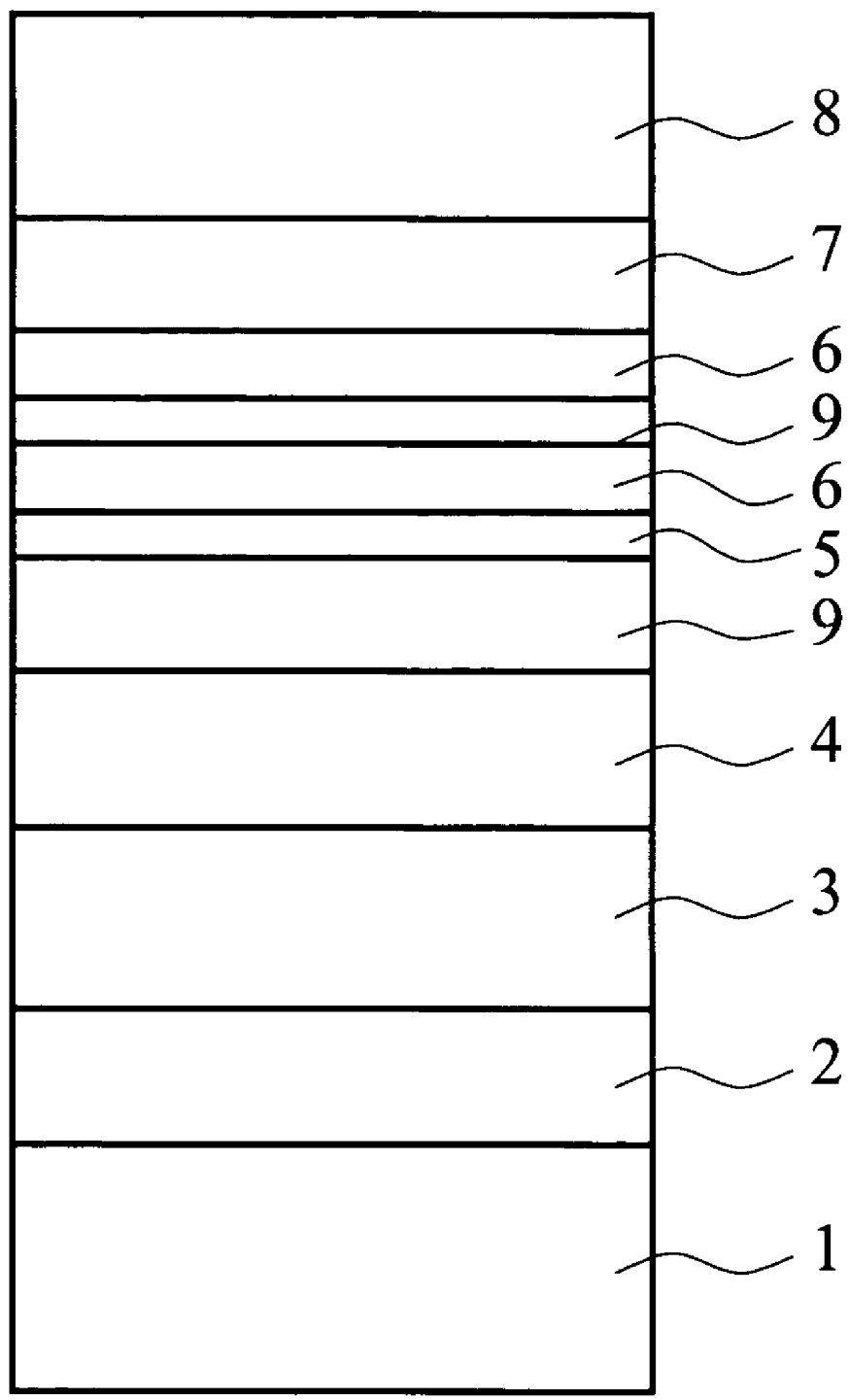
FIG. 18 is schematic diagram showing the cross-sectional structure of the magnetoresistance effect element of the example of the invention.

FIGS. 17 and 18 are schematic diagrams showing the cross-sectional structure of the magnetoresistance effect elements of this example. The same reference numerals are given to the same elements as what were mentioned above about FIG. 1 through FIG. 16 also about these figures, and detailed explanation is omitted.

That is, in the structure of FIG. 17, the phase separation layer 9 is inserted not only the portion of a spacer layer but in the magnetization pinned layer 4. Moreover, in the structure of FIG. 18, the phase separation layer 9 is inserted not only the portion of a spacer layer but in the magnetization free layer 6.

The magnetoresistance effect elements of this example were fabricated by the methods almost same as the method mentioned above about the first example.

The thickness and material of each layer which constitutes the magnetoresistance effect element shown in FIG. 17 are as the following:

Si substrate (1)/5 nm Ta (2)/200 nm Cu (2)/5 nm $(Ni_{80}Fe_{20})_{78}Cr_{22}$ (2)/10 nm PtMn (3)/2 nm CoFe (4)/0.5 nm CuNiFe (9)/2.5 nm CoFe (4)/0.5 nm Cu (5)/0.8 nm CuNiFe (9)/3 nm CoFe (6)/2 nm Ta (7)/200 nm Cu (8).

In the above, the reference numerals expressed in FIG. 17 are given to the each corresponding layer with parenthesis.

The thickness and material of each layer which constitutes the magnetoresistance effect element shown in FIG. 18 are as the following:

Si substrate (1)/5 nm Ta (2)/200 nm Cu (2)/5 nm $(Ni_{80}Fe_{20})_{78}Cr_{22}$ (2)/10 nm PtMn (3)/4 nm CoFe (4)/0.2 nm Cu (5)/0.8 nm CuNiFe (9)/1 nm Cu (5)/1 nm CoFe (6)/0.3 nm AlAg (9)/3 nm NiFe (6)/2 nm Ta (7)/200 nm Cu (8).

In the above, the reference numerals expressed in FIG. 18 are given to the each corresponding layer with parenthesis.

These magnetoresistance effect elements were fabricated by the methods almost same as the method mentioned above about the first example.

However, after the film forming process, the magnetic phase separation layer 9 between the magnetization pinned layer 4 and the magnetization free layer 6 was oxidized by irradiating an ion beam containing oxygen ion. In contrast, the phase separation layer 9 inserted into the magnetization pinned layer 4 or the magnetization free layer 6 was formed by irradiating the ion beam which contained oxygen ion simultaneously with the film forming.

CuNiFe which is the base material of the phase separation layer 9 is expressed by the following composition formula:

$$Cu_x(Ni_{100-y}Fe_y)_{100-x}:$$

where composition x was set to 1, 10, 20 and 50, and composition y was set to 0, 0.2 and 0.5. The AlAg alloy was $Al_{90}Ag_{10}$ (atomic %).

After the sample formation, a magnetic field of 5 kOe was applied in a vacuum, and a heat treatment of 10 hours was carried out at 300 degrees centigrade.

Thus, as a result of evaluating the characteristic of the fabricated magnetoresistance effect element, the good magnetoresistance change MR and good resistance R comparable as the third example were obtained. Moreover, the comparable good characteristics were acquired with both the structure of FIG. 17 and the structure of FIG. 18.

On the other hand, when $Al_{90}Au_{10}$ was used as the base material of the phase separation layer 9, the same good characteristic was also acquired.

THE FIFTH EXAMPLE

Next, the magnetoresistance effect element where the first embodiment and the second embodiment are combined will be explained as the fifth example of the invention.

Figure 19:
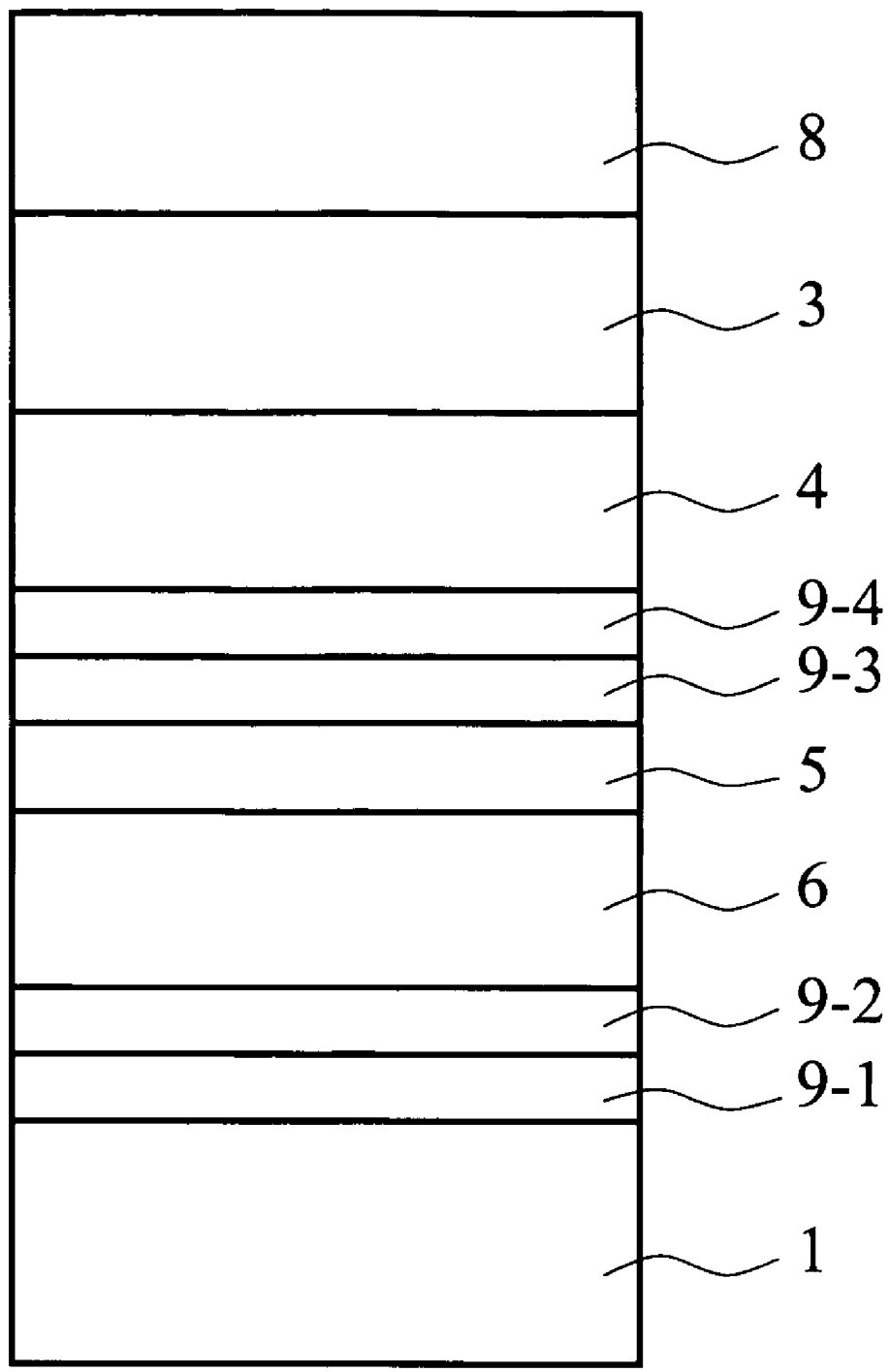
FIG. 19 is schematic diagram showing the cross-sectional structure of the magnetoresistance effect element of the example of the invention.

FIG. 19 is a schematic diagram showing the cross-sectional structure of the magnetoresistance effect element of this example. The same reference numerals are given to the same elements as what were mentioned above about FIG. 1 through FIG. 18 also about this figure, and detailed explanation is omitted.

That is, the structure of this example has the laminated structure of the so-called "top-type" where the magnetization free layer 6 is provided in the bottom side when seen from the substrate electrode 1. And in this laminated structure, the phase separation layers 9-3 and 9-4 are provided in the portion of the spacer layer, and the phase separation layers 9-1 and 9-2 are inserted between the electrode 1 and magnetization free layer 6.

The thickness and material of each layer which constitute the magnetoresistance effect element of this example are as the following:

Si substrate (1)/3 nm Ta (2)/200 nm Cu (2)/2 nm $Al_{70}Ag_{30}$ (9-1)/0.8 nm $Cr_{80}Cu_{20}$ (9-2)/4 nm $Co_{90}Fe_{10}$ (6)/1 nm $Al_{70}Cu_{30}$ (9-3)/1 nm $Cu_{20}Ni_{40}CO_{20}$ (9-4)/0.5 nm Cu (5)/4 nm $Co_{90}Fe_{10}$ (4)/15 nm PtMn (3)/2 nm Ru (7)/200 nm Cu (8).

In the above, the reference numerals expressed in FIG. 19 are given to the each corresponding layer with parenthesis.

These magnetoresistance effect elements of this example were fabricated by the methods almost same as the method mentioned above about the first example. As the oxidization process for the phase separation layers 9-1, 9-2, and 9-3, after forming the base material film, the oxygen of flux of 4 sccm was made into the oxygen radical using 50 watts (W) of RF, and was irradiated for about 30 seconds with a beam energy of 100 volts (V) of accelerating voltage.

With regard to the CuNiCo alloy of the phase separation layer 9-4, after promoting the spinodal decomposition by Ar ion irradiation of low energy after depositing the base material, an oxidation process was carried out by the same method as what was mentioned above while setting the RF power at 70 W.

The area resistance per 1 square micron area was 350 ($m\Omega\mu m^2$) and the magnetoresistance rate of change of the magnetic characteristic after a heat treatment of the magnetoresistance effect element of this example was 5.5%. That is, the good characteristic was acquired and it was confirmed that the magnetoresistance effect element applicable to the actual magnetic head has been formed.

THE SIXTH EXAMPLE

Next, the magnetoresistance effect element where the first embodiment and the second embodiment are combined like the fifth example will be explained as the sixth example of the invention.

Figure 20:
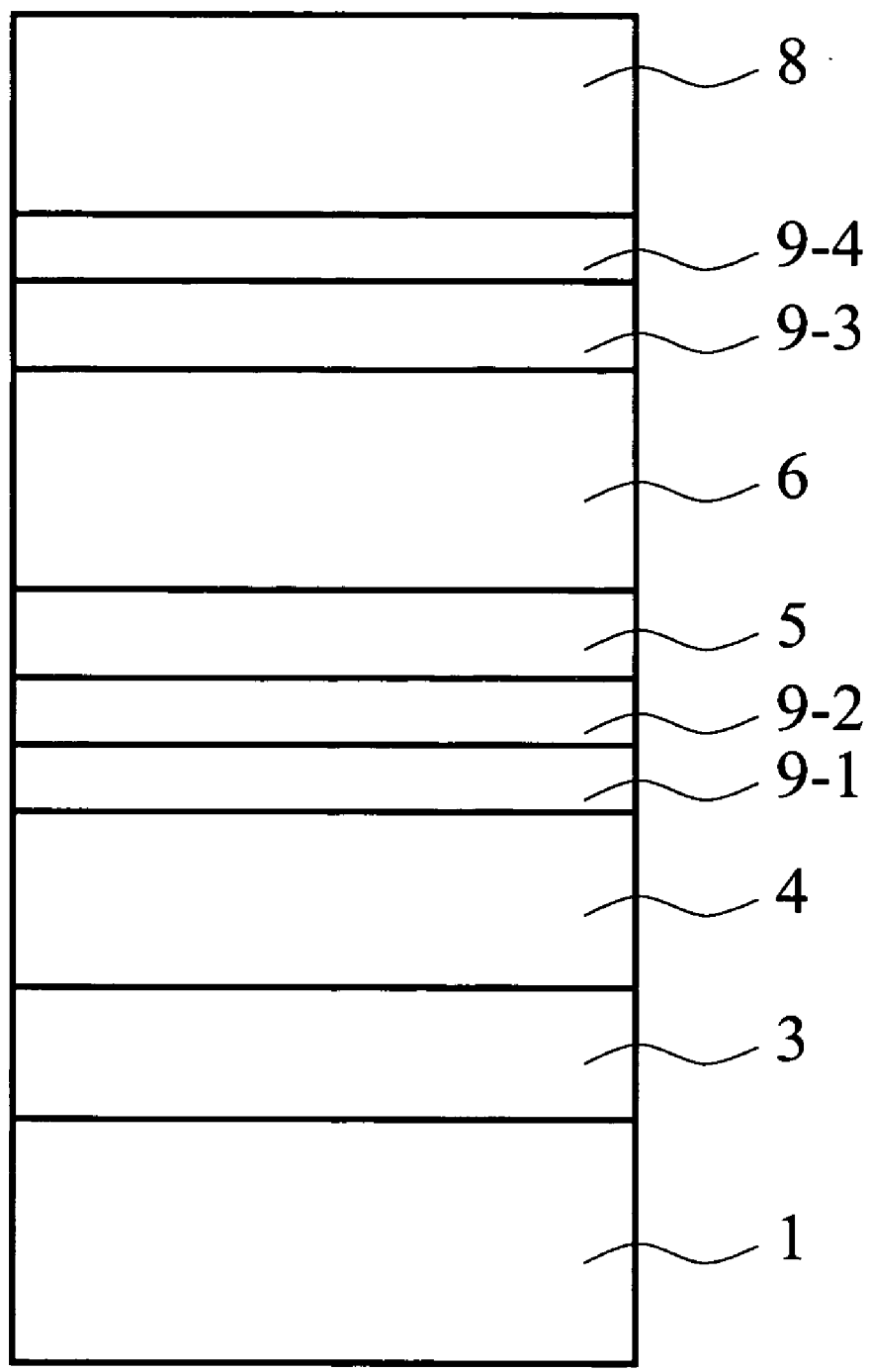
FIG. 20 is schematic diagram showing the cross-sectional structure of the magnetoresistance effect element of the example of the invention.

FIG. 20 is a schematic diagram showing the cross-sectional structure of the magnetoresistance effect element of this example. The same reference numerals are given to the same elements as what were mentioned above about FIG. 1 through FIG. 19 also about this figure, and detailed explanation is omitted.

That is, the structure of this example has the laminated structure of the so-called "bottom type" where the magnetization pinned layer 4 is provided in the bottom side, when seen from the substrate electrode 1. And also in this lamination structure, the phase separation layers 9-1 and 9-2 are provided in the portion of the spacer layer, and the phase separation layers 9-3 and 9-4 are inserted also between the magnetization free layer 6 and the electrode 8.

The thickness and material of each layer which constitutes the magnetoresistance effect element of this example are as the following:

Si substrate (1)/5 nm Ta (2)/2 nm Ru (2)/15 nm PtMn (3)/4 nm $Co_{90}Fe_{10}$ (4)/1 nm CuNiFe (9-1)/0.7 nm $Al_{70}Cu_{30}$ (9-2)/0.2 nm Cu (5)/4 nm $Co_{90}Fe_{10}$ (6)/0.5 nm $Al_{80}Au_{20}$ (9-3)/1 nm $Al_{70}Cu_{30}$ (9-4)/200 nm Cu (8).

In the above, the reference numerals expressed in FIG. 20 are given to the each corresponding layer with parenthesis.

The magnetoresistance effect elements of this example were fabricated by the methods almost same as the method mentioned above about the fifth example.

The area resistance per 1 square micron area of the magnetic characteristic after a heat treatment of the magnetoresistance effect element of this example was 250 ($m\Omega\mu m^2$), and amount $A\Delta R$ of area resistance change per 1 square micron area (which corresponds to the output of a magnetic head) was 25 ($m\Omega\mu m^2$). That is, a very large amount $A\Delta R$ of area resistance change was obtained, and it was confirmed to be sufficiently possible to apply the magnetoresistance effect element of this example to an actual magnetic head.

THE SEVENTH EXAMPLE

Next, the magnetoresistance effect elements using the aluminum (Al)-silver (Ag)-tantalum (Ta) system or aluminum (Al)-copper (Cu) system will be explained as the seventh example of the invention.

In this example, the magnetoresistance effect element having a basic structure same as the one shown in FIG. 1 was manufactured.

However, the magnetization pinned layer 4 has the so-called "synthetic structure" in this example.

The magnetoresistance effect elements of this example were fabricated by the methods almost same as the method mentioned above about the first example. However, in the formation process of the phase separation layer 9, an argon ion of electric power 50 watts was first irradiated with an accelerating voltage of 50 volts after forming the film in order to give a phase separation, and an oxidization process was subsequently performed by irradiating an ion beam which contained oxygen ion. Furthermore, after the magnetoresistance effect element formation, heat treatment of 270 degrees centigrade for 10 hours in a magnetic field was carried out in order to improve the magnetic characteristics.

The thickness and material of each layer which constitutes a magnetoresistance effect element are as the following:

Si substrate (1)/5 nm Ta (2)/200 nm Cu (2)/5 nm $(Ni_{80}Fe_{20})_{78}Cr_{22}$ (2)/10 nm PtMn (3)/3.5 nm CoFe (4)/1.0 nm Ru (4)/3.5 nm CoFe (4)/0.2 nm Cu (5A)/1.1 nm AlAgTa or AlCu (9)/0.5 nmCu (5B)/3.5 nm CoFe (6)/2 nm Ru (7)/200 nm Cu (8).

In the above, the reference numerals expressed in FIG. 1 are given to the each corresponding layer with parenthesis.

As a base material of the phase separation layer 9, $(Al_{80}Ta_{20})_{80}Ag_{20}$ alloy or Al—Cu alloy was used. In the case of the Al—Cu system, the spinodal decomposition takes place at the composition of $Al_{70}Cu_{30}$. However, since copper diffuses from the lower Cu layer (5A) and the upper Cu layer (5B), the initial composition of copper in the AlCu layer (9) may be made lower than the spinodal composition.

The inventors conducted the experiment in order to investigate the structure of the phase separation layer 9 in relation to this example. First, 0.2 nm Cu (5A)/1.1 nm AlAgTa alloy (9) was laminated twice on Si substrate (1)/5 nm Ta (2)/10 nm PtMn (3)/3.5 nm CoFe (4) with the same conditions as the phase separation layer 9 of $(Al_{80}Ta_{20})_{80}Ag_{20}$ alloy.

After performing a heat treatment, the phase separation layer 9 was observed by planar TEM and sectional TEM, and composition and its distribution were investigated by SIMS (secondary ion mass spectroscopy).

As a result, the structure of the phase separation layer 9 was almost the same as the one shown in FIG. 8. Specifically, planar TEM and SIMS showed that silver (Ag) phase 9B (D2) with high purity whose particle diameter is 2–3 nm, oxide insulator phase 9A (D1) having a composition close to $Al_2O_3$, and oxide insulating phase 9A (D2) having a composition close to $Ta_2O_5$ were formed. These separated phases are produced by spinodal decomposition. From the sectional TEM, it was confirmed that the silver (Ag) phase 9B is formed in a pillar shape so that minute current paths were formed in the direction of thickness.

Similar results were obtained in the samples where AlCu alloy was used instead of the AlAgTa alloy.

The area resistance per 1 square micron area of the magnetic characteristic after a heat treatment of the magnetoresistance effect elements of this example was 250 $(m\Omega\mu m^2)$, and a rate of magnetoresistance change was 6.5%. It was confirmed to be sufficiently possible to apply the magnetoresistance effect element of this example to an actual magnetic head.

THE EIGHTH EXAMPLE

Next, the magnetoresistance effect element using the phase separation of the iron (Fe)-magnesium (Mg) system alloy will be explained as the 8th example of the invention.

In this example, the magnetoresistance effect element having a basic structure same as the one shown in FIG. 1 was manufactured. However, the magnetization pinned layer 4 has the so-called "synthetic structure" in this example.

The magnetoresistance effect elements of this example were fabricated by the methods almost same as the method mentioned above about the first example. However, in the formation process of the phase separation layer 9, an ion beam including oxygen ion was irradiated in the film growth step.

The thickness and material of each layer which constitutes a magnetoresistance effect element are as the following:

Si substrate (1)/5 nm Ta (2)/200 nm Cu (2)/5 nm $(Ni_{80}Fe_{20})_{78}Cr_{22}$ (2)/10 nm PtMn (3)/2.5 nm CoFe (4)/0.9 nm Ru (4)/2.5 nm CoFe (4)/0.5 nm Cu (5A)/1.0 nm FeMg (9)/1.0 nm Cu (5B)/3 nm CoFe (6)/2 nm Ta (7)/200 nm Cu (8).

In the above, the reference numerals expressed in FIG. 1 are given to the each corresponding layer with parenthesis.

The magnetoresistance effect MR and the area resistance RA in the case where $Mg_{90}Fe_{10}$ alloy was used as the base material of the phase separation layer 9 and the oxidization process was performed were as the following:

TABLE 6

| Material of the phase separation layer 9 | MR, % | RA, $\Omega\mu m^2$ |
|---|---|---|
| $Mg_{90}Fe_{10}$ (with oxidation process) | 8.0 | 0.25 |

On the other hand, the inventors have fabricated four kinds of samples where the composition x of $Mg_{100-x}Fe_x$ alloy of the phase separation layer 9 were set to 0.5 10, 20 and 40, respectively, and have investigated the dependence of the crystallinity on the oxidation process by cross-sectional TEM observation.

With regard to the samples where the oxidization process were not carried out, a vague phase separated structure including Mg-rich phase and Fe-rich phase with a width of about 2 nm was observed. On the other hand, with regard to the samples where the oxidization process were carried out, a vague phase separated structure including Mg-rich phase and Fe-rich phase with a width of about 2 nm was also observed.

Moreover, as a result of analyzing the oxygen content for each phase, although some oxygen was observed in the Fe-rich phase, it was confirmed that almost all oxygen existed in the Mg-rich phase. That is, it has confirmed that the phase separation layer 9 had a structure including the conductive Fe-rich phase of highly pure metal, and the oxide insulator phase close to MgO formed by spinodal decomposition and the oxidization process.

Moreover, each phase was finely dissociated and distributed within the film plane by spinodal decomposition, and plane TEM observation showed that the occupancy area of the Fe-rich phase was just over or below about 10%.

On the other hand, when $Mg_{80}Fe_{20}$ alloy (x=20) was used as the base material and the oxidization process was carried out, the magnetoresistance effect MR and the area resistance RA were as the following:

TABLE 7

| Material of the phase separation layer 9 | MR, % | RA, $\Omega\mu m^2$ |
|---|---|---|
| $Mg_{80}Fe_{20}$ (with oxidation process) | 6.5 | 0.2 |

Moreover, also in the case of using the FeMg system alloy, since the region of a high electric conduction phase is too small if the composition of Fe is less than 1%, the area resistance RA per one square micron will increase to more than 1 Ωμm$^2$, therefore, the noise and frequency response characteristics will fall like the case of TMR element.

On the other hand, if the composition of Fe exceeds 40 atomic %, the region of the high electric conduction phase becomes too large, and the current constriction effect will not be acquired any longer, and R and AR will fall like the case where metal intermediate layers, such as Cu, are used.

Therefore, it is desirable to set the composition of Fe within a range between 1 atomic % and 40 atomic %.

The inventors have replaced some part of Mg of the FeMg alloy with one of aluminum (Al), calcium (Ca), silicon (Si), germanium (Ge), boron (B), tantalum (Ta), tungsten (W), niobium (Nb), zirconium (Zr), titanium (Ti), hafnium (Hf), chromium (Cr), zinc (Zn), lithium (Li), and gallium (Ga). By investigating these samples, it was found that almost the same effect was obtained with these samples by appropriately adjusting the composition of the base material.

Further, with regard to the samples where part of Fe were replaced with nickel (Ni) or cobalt (Co), it was found that almost the same effect was obtained with these samples by appropriately adjusting the composition of the base material.

Moreover, on the other hand, when molybdenum (Mo), calcium (Ca), titanium (Ti), a zirconium (Zr), niobium (Nb), hafnium (Hf), tantalum (Ta), boron (B), aluminum (Al) or silicon (Si) was used instead of Mg of the FeMg alloy, the same effect was acquired.

Considering application to an actual magnetic head, the composition of Fe in the FeMg system alloy can be appropriately decided in the range between 1 atomic % and 40 atomic % according to the magnetoresistance effect MR and resistance R which are needed.

THE NINTH EXAMPLE

Next, the magnetoresistance effect element using the phase separation of the aluminum (Al)-nickel (Ni) system alloy will be explained as the ninth example of the invention.

Also in this example, the magnetoresistance effect element having a basic structure same as the one shown in FIG. 1 was manufactured. However, the interface adjusting layer 5B was not provided. The magnetization pinned layer 4 has the so-called "synthetic structure" in this example. The magnetoresistance effect elements of this example were fabricated by the methods almost same as the method mentioned above about the first example.

The thickness and material of each layer which constitutes a magnetoresistance effect element are as the following:

Si substrate (1)/5 nm Ta (2)/200 nm Cu (2)/5 nm (Ni$_{80}$Fe$_{20}$)$_{78}$Cr$_{22}$ (2)/10 nm PtMn (3)/2.5 nm CoFe (4)/0.9 nm Ru (4)/2.5 nm CoFe (4)/1.2 nm AlNi (9)/2.0 nm Cu (5)/3 nm CoFe (6)/2 nm Ta (7)/200 nm Cu (8).

In the above, the reference numerals expressed in FIG. 1 are given to the each corresponding layer with parenthesis.

Here, the AlNi alloy used as the base material of the phase separation layer 9 can be expressed by the composition formula Al$_{100-x}$Ni$_x$, and the composition x was set to 0.5, 1, 10, 20, 50 and 60 (atomic %). Moreover, the magnetic coupling interception layer 5 which consists of Cu of 2.0 nm thick was inserted between the phase separation layer 9 and the magnetization free layer 6.

The magnetic coupling interception layer 5 has the role to intercept the magnetic coupling between the phase separation layer 9 which consist of an AlNi alloy and magnetically free layer 6. Therefore, the thickness of the magnetic coupling interception layer 5 is preferably in a range between 1 nm and 3 nm.

On the occasion of formation of the phase separation layer 9, an ion beam which contained oxygen ion was irradiated on the substrate simultaneously with the film deposition. After formation of the element, a magnetic field of 5 kOe was applied in the vacuum, and heat treatment of 10 hours was given at 300 degrees centigrade.

The magnetoresistance effect MR of the magnetoresistance effect element of this example was 3–10%, and the resistance R was 0.15–1.0 ohms except the case where composition x was set to 0.1 and 60. Thus, the good characteristics were obtained.

On the other hand, in the case of the magnetoresistance effect elements where composition x was set to 5 and 60, it turned out that the MR was 0.5% or less, and the AΔR was also very small, and thus, they were not good for a practical use.

The inventors have investigated the samples where gold (Au), silver (Ag), platinum (Pt), palladium (Pd), iridium (Ir), or osmium (Os) was used instead of copper (Cu) as a material of the magnetic coupling interception layer 5. As a result of investigating these samples, it was confirmed that almost the same magnetic interception effect was obtained. Moreover, in this example, even if the magnetization pinned layer 4 oxidized a little, it also turned out that degradation of the characteristics of a magnetoresistance effect element was hardly seen.

Furthermore, in the case of the magnetoresistance effect element which did not include the magnetic coupling interception layer 5, under the influence of the phase separation layer 9 which has some magnetism, the magnetic field response of the magnetically free layer 6 was degraded, and therefore MR sensitivity fell.

From the above result, it turned out that it becomes possible to offer the magnetoresistance effect element of the good characteristic by providing the magnetic coupling interception layer 5 and by further using the phase separation layer 9 which was formed from the base material alloy having the composition which realized spinodal decomposition and oxidization of the aluminum-nickel phase.

Moreover, the magnetoresistance effect elements using the alloy where Ni of the composition formula Al$_{100-x}$Ni$_x$ was replaced by Co or Fe were investigated. As a result, the almost same result as Al$_{100-x}$Ni$_x$ was obtained.

Moreover, also when molybdenum (Mo), magnesium (Mg), tungsten (W), titanium (Ti), zirconium (Zr), niobium (Nb), hafnium (Hf), tantalum (Ta), boron (B) or silicon (Si) was used instead of aluminum, the same effect as aluminum was acquired.

Furthermore, the same effect was acquired even in the case where the phase separation layer had a combined structure of a phase separation layer which consists of the Al$_{100-x}$Ni$_x$ system alloy, and a phase separation layer obtained from a base material using Al—Ag alloy, as illustrated in FIG. 10.

THE TENTH EXAMPLE

Next, the magnetoresistance effect element using the phase separation of aluminum (Al)-cobalt (Co) system alloy will be explained as the tenth example of the invention.

Also in this example, the magnetoresistance effect element having a basic structure same as the one shown in FIG. 1 was manufactured. However, the interface adjusting layer 5B was not provided. The magnetization pinned layer 4 has the so-called "synthetic structure" in this example. The magnetoresistance effect elements of this example were fabricated by the methods almost same as the method mentioned above about the first example.

The thickness and material of each layer which constitutes a magnetoresistance effect element are as the following:

Si substrate (1)/5 nm Ta (2)/200 nm Cu (2)/5 nm $(Ni_{80}Fe_{20})_{78}Cr_{22}$ (2)/10 nm PtMn (3)/2.5 nm CoFe (4)/0.9 nm Ru (4)/2.5 nm CoFe (4)/1.0 nm AlCo (9)/2.0 nm Cu (5)/3 nm CoFe (6)/2 nm Ta (7)/200 nm Cu (8).

In the above, the reference numerals expressed in FIG. 1 are given to the each corresponding layer with parenthesis. Here, the AlCo alloy used as the base material of the phase separation layer 9 can be expressed by the composition formula $Al_{100-x}Co_x$, and the composition x was set to 0.5, 1, 10, 20, 50 and 60 (atomic %). Moreover, the magnetic coupling interception layer 5 which consists of Cu of 2.0 nm thick was inserted between the phase separation layer 9 and the magnetization free layer 6.

The magnetic coupling interception layer 5 has the role to intercept the magnetic coupling between the phase separation layer 9 which consist of an AlCo alloy and magnetically free layer 6. Therefore, the thickness of the magnetic coupling interception layer 5 is preferably in a range between 1 nm and 3 nm.

On the occasion of formation of the phase separation layer 9, an ion beam which contained oxygen ion was irradiated on the substrate simultaneously with the film deposition. After formation of an element, a magnetic field of 10 kOe was applied in the vacuum, and a heat treatment of 10 hours was given at 300 degrees centigrade.

The magnetoresistance effect MR of the magnetoresistance effect element of this example was 3–10%, and the resistance R was 0.15–1.0 ohms except the case where composition x was set to 0.1 and 60. Thus, the good characteristics were obtained.

On the other hand, in the case of the magnetoresistance effect elements where composition x was set to 5 and 60, it turned out that the MR was 0.5% or less, and the AΔR was also very small, and thus, they were not good for a practical use.

The inventors have investigated the samples where gold (Au), silver (Ag), platinum (Pt), palladium (Pd), iridium (Ir) or osmium (Os) was used instead of copper (Cu) as a material of the magnetic coupling interception layer 5. As a result of investigating these samples, it was confirmed that almost the same magnetic interception effect was obtained.

Moreover, in this example, even if the magnetization pinned layer 4 oxidized a little, it also turned out that degradation of the characteristic of a magnetoresistance effect element was hardly seen.

Furthermore, in the case of the magnetoresistance effect element which did not include the magnetic coupling interception layer 5, under the influence of the phase separation layer 9 which has some magnetism, the magnetic field response of the magnetically free layer 6 was degraded, and therefore MR sensitivity fell.

From the above result, it turned out that it becomes possible to offer the magnetoresistance effect element of the good characteristic by providing the magnetic coupling interception layer 5 and by further using the phase separation layer 9 which was formed from the base material alloy having the composition which realized spinodal decomposition and oxidization of the Al—Co phase.

Moreover, the magnetoresistance effect elements using the alloy where Co of the composition formula $Al_{100-x}Co_x$ was replaced by Ni or Fe were investigated. As a result, the almost same result as $Al_{100-x}Co_x$ was obtained.

Moreover, also when molybdenum (Mo), magnesium (Mg), tungsten (W), titanium (Ti), zirconium (Zr), niobium (Nb), hafnium (Hf), tantalum (Ta), boron (B) or silicon (Si) was used instead of aluminum, the same effect as aluminum was acquired.

THE ELEVENTH EXAMPLE

Next, specularity dGs was calculated in the case where AlAg alloy was used as the base material of the phase separation layer, as the eleventh example of the invention.

Specularity dGs was obtained from a laminated structure as will be explained below, by considering the magnetoresistance rate of change (CIP-MR) and specific resistance (Rs) in a film plane. Specularity dGs is one index of expressing the rate of specular reflection of electrons. In the case of CIP type MR elements, MR rate of change tends to become high if the specularity dGs becomes large.

The structure used in this example is as follows:

Substrate/5 nm Ta/2 nm Ru/15 nm PtMn/2 nm CoFe/1.0 nm Ru/2 nm CoFe/2.5 nm Cu/2 nm CoFe/0.2 nm Cu/1.0 nm $Al_{100-x}Ag_x$/0.2 nm Cu/2 nm Ru where the thickness and the material of the each layer are shown.

Alloy system which constitutes the phase separation layer was $Al_{100-x}Ag_x$. The composition x was set to 0, 2, 10, 20, 30, 40, and 50. A heat treatment of 10 hours in a magnetic field at 270 degrees centigrade was carried out after the film formation. The magnetoresistance rate of change of the fabricated magnetoresistance effect element was measured, and specularity dGs was evaluated.

Figure 21:
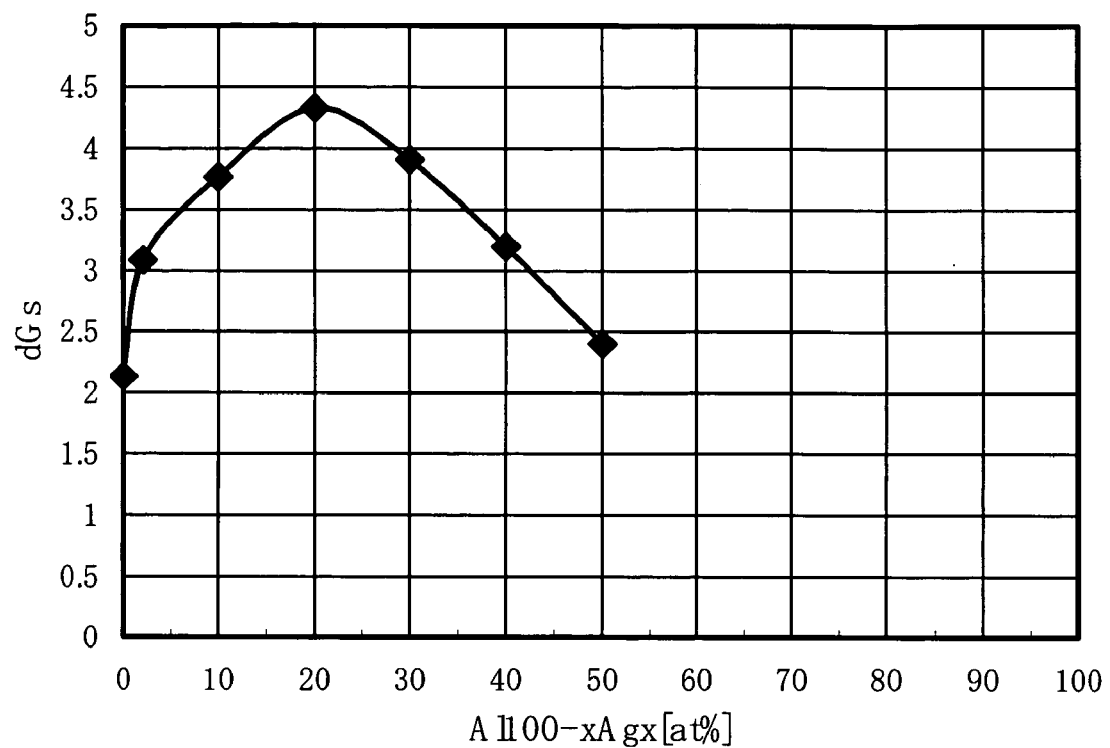
FIG. 21 is a graphical representation showing the relationship between the composition x and specularity dGs ($\times 10^{-3}$, $1/\Omega$)

FIG. 21 is a graphical representation showing the relation between specularity dGs ($\times 10^{-3}$, $1/\Omega$) and composition x. As shown in the figure, specularity dGs increases greatly from 2.1 to 3.1 ($\times 10^{-3}$, $1/\Omega$) only by increasing the amount of silver (Ag) from zero to 2 atomic %. If the amount of addition of the silver (Ag) to aluminum (Al) is increased further, in near 20 atomic % which is the composition region closest to induce spinodal decomposition with the Al—Ag system alloy, specularity dGs will become maximum of about 4.3. If the silver (Ag) amount of addition is increased further, specularity dGs will decrease again, and if 40 atomic % is exceeded, specularity becomes 3.0 ($\times 10^{-3}$, $1/\Omega$) or less.

If the further phase separation is promoted, a low resistance phase is formed and a CPP type element is created by oxidization process, ion irradiation, etc. to such an Al—Ag system phase separation material, the characteristic which was mentioned above as the first example will be acquired.

That is, the result of having investigated the dependability over the composition x of specularity dGs and MR in the state of performing neither oxidization process nor phase separation process using CIP type MR element, and the result of having investigated the dependability over the composition x of MR and RA using the CPP type element were in agreement in general.

According to the result of examination of the inventors, when specularity dGs is 3.0 ($\times 10^{-3}$, $1/\Omega$) or more in a CPP element, the characteristics of the magnetoresistance effect element become excellent.

THE TWELFTH EXAMPLE

Next, the BMR (ballistic magnetoresistance effect) type resistance effect element formed by providing the phase separation layer having magnetism between a pair of ferromagnetic layers will be explained as the twelfth example of the invention.

Figure 22:
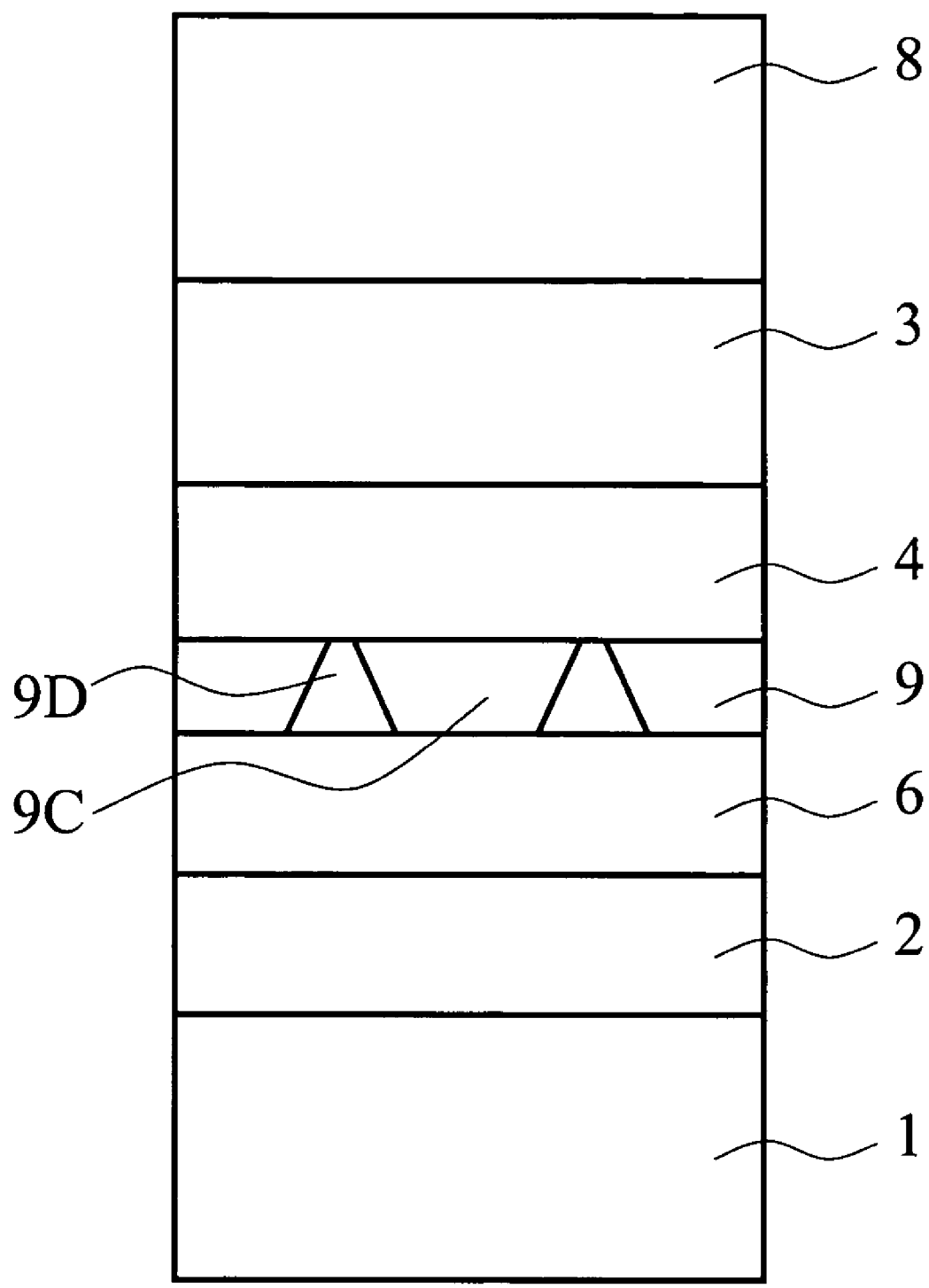
FIG. 22 is a schematic sectional view showing the example of the BMR type magnetoresistance effect element.

FIG. 22 is a schematic diagram showing the principal part sectional structure of the magnetoresistance effect element manufactured in this example.

The magnetoresistance effect elements of this example were fabricated by the methods almost same as the method mentioned above about the first example.

The thickness and material of each layer which constitutes a magnetoresistance effect element are as the following:

Si substrate (1)/100 nm $SiO_2$ (1)/10 nm Ta (2)/200 nm Cu (2)/5 nm Ta (2)/2.5 nm CoFe (6)/1.5 nm $Ni_{80}Fe_{20}$ (6)/5 nm $Al_{80}Ni_{20}$ (9)/3 nm $Co_{90}Fe_{10}$ (4) 15 nm PtMn (3)/5 nm Ta (8)/200 nm Cu (8)/100 nm Au (8).

In the above, the reference numerals expressed in FIG. 22 are given to the each corresponding layer with parenthesis.

After formation of the laminated structure, a magnetic field of 10 kOe was applied in the vacuum, and a heat treatment of 10 hours was given at 300 degrees centigrade.

As the comparative samples, elements having the Al—Ni layers without phase separation process and oxidization process were also fabricated, and the characteristics were also evaluated.

When MR rate of change was measured in a magnetic field of plus or minus 500 Oe, MR of this example where phase separation and oxidization process were carried out showed as large as 20%. On the other hand, MR rate of change of the comparative samples which did not experience these processes was 2% or less.

That is, it was confirmed that MR rate of change had increased sharply in the invention. Existence of BMR can be considered as a reason of the increase in this large MR rate of change. That is, the nickel (Ni) which is the magnetic element included the phase separation layer 9 or nickel-rich phase touched the upper and lower magnetic layers 4 and 6, and the resultant magnetic point contacts have produced BMR.

The inventors observed the element of this example by sectional TEM. As a result, a lattice image which was considered to be nickel was indistinctly observed to be connected between the upper and lower magnetic layers. That is, magnetic point contacts are formed by the nickel (or nickel-rich) phase formed by the phase separation, and thus BMR was generated.

THE THIRTEENTH EXAMPLE

Next, the magnetic reproducing apparatus which comprises the magnetoresistance effect element of the invention will be explained as the thirteenth example of the invention.

That is, the magnetoresistance effect element or the magnetic head explained with reference to FIGS. 1 through 22 can be incorporated in a recording/reproducing magnetic head assembly and mounted in a magnetic reproducing apparatus.

Figure 23:
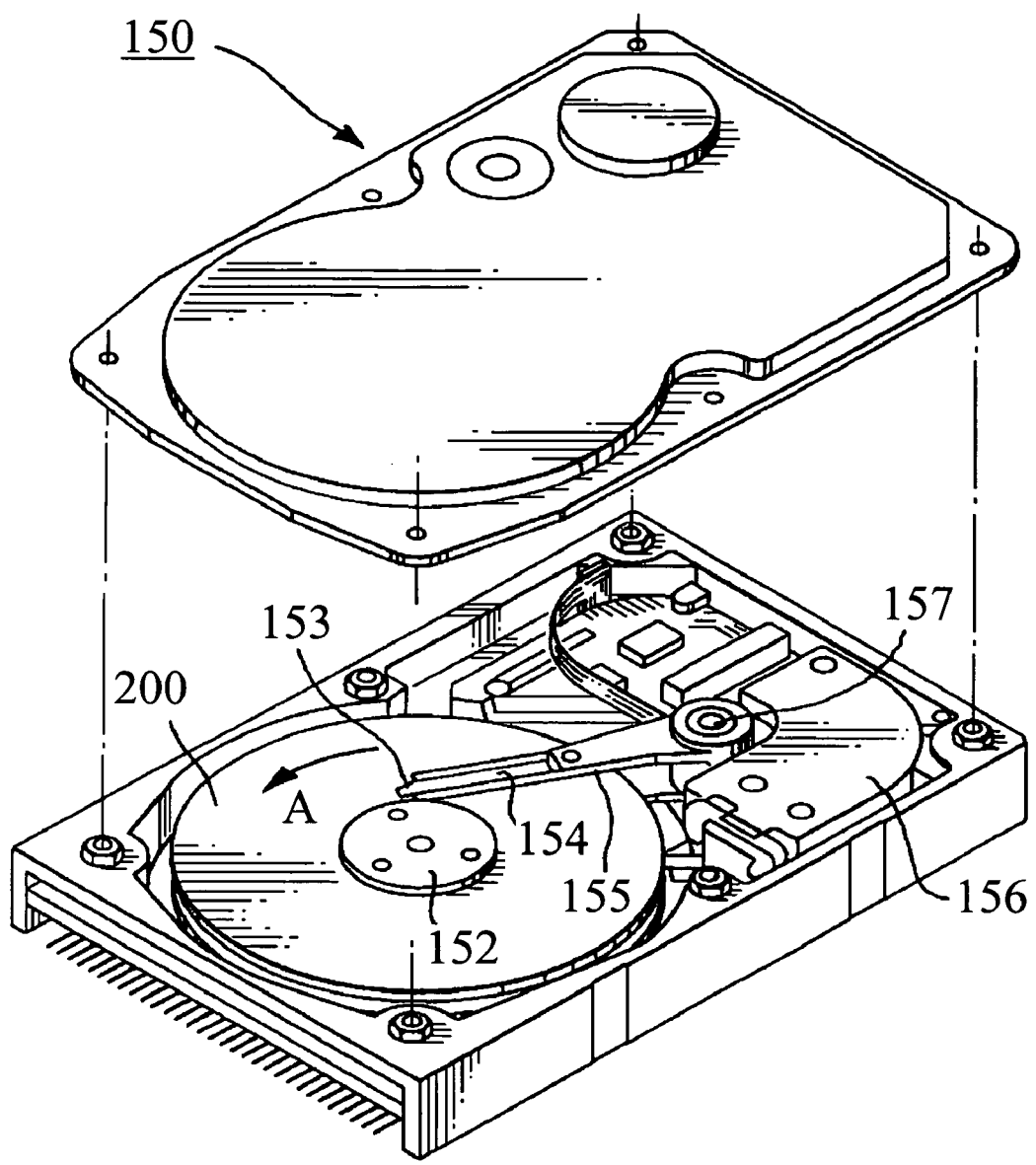
FIG. 23 is the principal part perspective diagram which illustrates the outline structure of the magnetic reproducing apparatus of the embodiment of the present invention.

FIG. 23 is a perspective view that shows outline configuration of this kind of magnetic reproducing apparatus. The magnetic reproducing apparatus 150 shown here is of a type using a rotary actuator. A magnetic reproducing medium disk 200 is mounted on a spindle 152 and rotated in the arrow A direction by a motor, not shown, which is responsive to a control signal from a controller of a driving mechanism, not shown. The magnetic reproducing apparatus 150 shown here may have a plurality of medium disks 200 inboard.

The medium disk 200 may be of a "lateral recording type" in which directions of the recording bits are substantially in parallel to the disk surface or may be of a "perpendicular recording type" in which directions of the recording bits are substantially perpendicular to the disk surface.

A head slider 153 for carrying out recording and reproduction of information to be stored in the medium disk 200 is attached to the tip of a film-shaped suspension 154. The head slider 153 supports a magnetoresistance effect element or magnetic head, for example, according to one of the foregoing embodiments of the invention, near the distal end thereof.

Once the medium disk 200 rotates, the medium-facing surface (ABS) of the head slider 153 is held floating by a predetermined distance above the surface of the medium disk 200. Also acceptable is a so-called "contact-traveling type" in which the slider contacts the medium disk 200.

The suspension 154 is connected to one end of an actuator arm 155 having a bobbin portion for holding a drive coil, not shown, and others. At the opposite end of the actuator arm 155, a voice coil motor 156, a kind of linear motor, is provided. The voice coil motor 156 comprises a drive coil, not shown, wound on the bobbin portion of the actuator arm 155, and a magnetic circuit made up of a permanent magnet and an opposed yoke that are opposed to sandwich the drive coil.

The actuator arm 155 is supported by ball bearings, not shown, which are located at upper and lower two positions of the spindle 157 and driven by the voice coil motor 156 for rotating, sliding movements.

Figure 24:
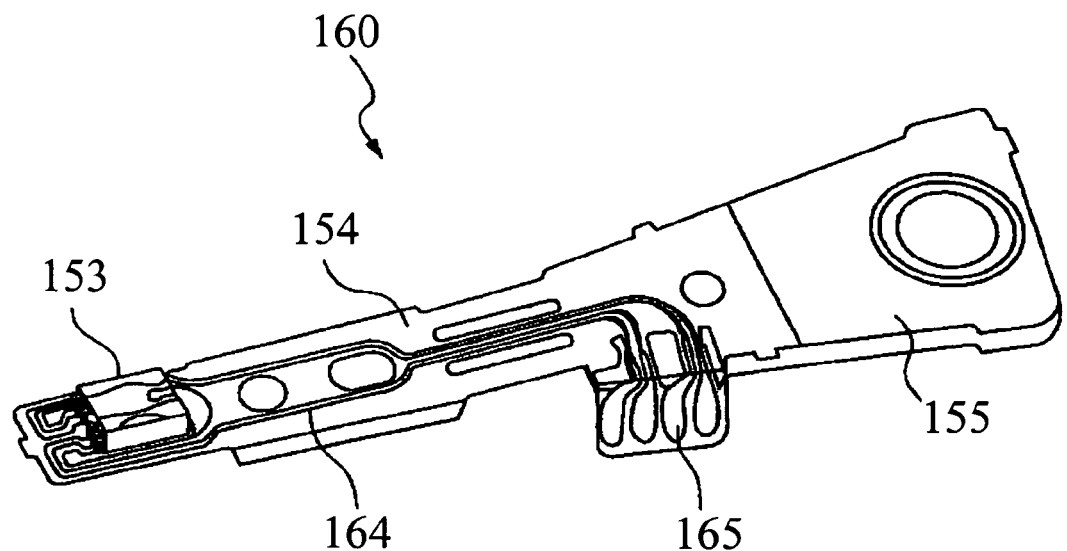
FIG. 24 is a perspective view of a magnetic head assembly at the distal end from an actuator arm 155 involved, which is viewed from the disk.

FIG. 24 is a perspective view of a magnetic head assembly at the distal end from an actuator arm 155 involved, which is viewed from the disk. The magnetic head assembly 160 includes the actuator arm 155 having the bobbin portion supporting the drive coil, for example, and the suspension 154 is connected to one end of the actuator arm 155.

At the distal end of the suspension 154, a head slider 153 carrying the magnetoresistance effect element as explained with reference to FIGS. 1 through 22 is provided. The suspension 154 has a lead 164 for writing and reading signals, and the lead line 164 is connected to electrodes of the magnetic head incorporated in the head slider 153. Numeral 165 in FIG. 24 denotes an electrode pad of the magnetic head assembly 160.

According to this example, one of the magnetoresistance effect elements already explained in conjunction with the aforementioned embodiments is used as the magnetoresistance effect element, information magnetically recorded on the medium disk 200 under a higher recording density than before can be read reliably.

FOURTEENTH EXAMPLE

Next, a magnetic memory having the magnetoresistance effect element of the embodiment will be explained as the fourteenth example of the invention. That is, a magnetic memory, such as a magnetic random access memory (MRAM), where memory cells are arranged in the shape of a matrix can be realized by using the magnetoresistance effect element of the embodiment.

Figure 25:
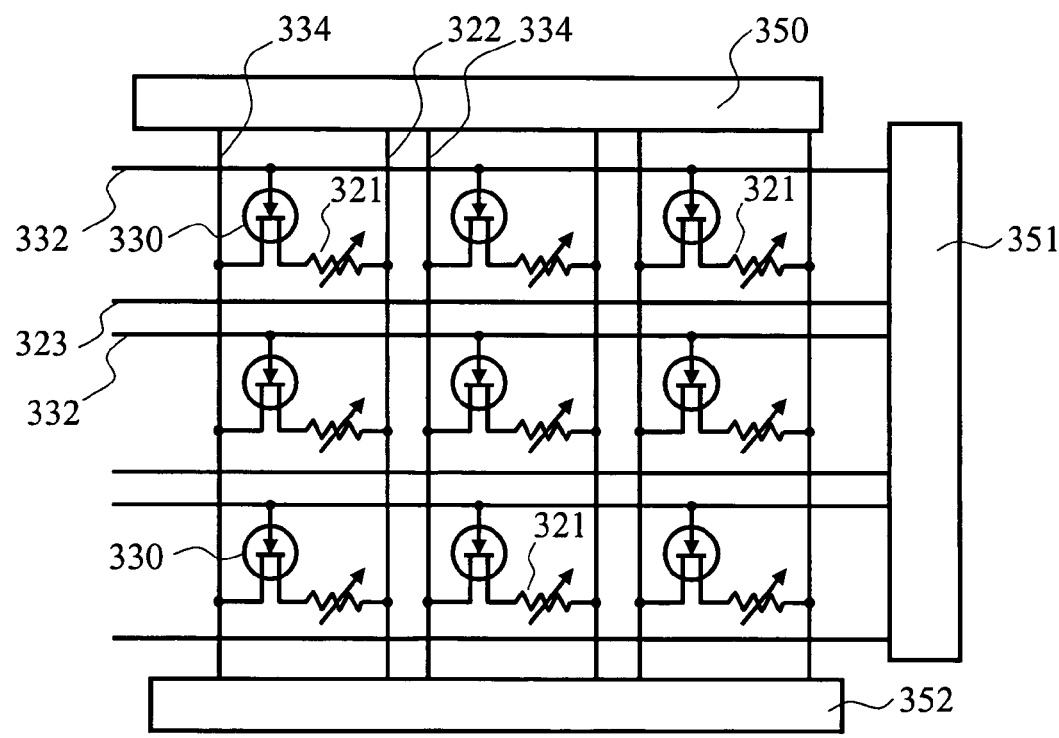
FIG. 25 is the schematic diagram which illustrates the matrix structure of the magnetic memory of the embodiment of the present invention.

FIG. 25 is a conceptual diagram which exemplifies the matrix structure of the magnetic memory of the embodiment. That is, this figure shows the circuit structure of the embodiment in the case of having arranged the memory cells each of which includes a magnetoresistance effect element mentioned above with reference to FIGS. 1 through 22, in the shape of a matrix array.

In order to choose one bit in an array, it has the sequence decoder 350 and the line decoder 351. By selecting the bit line 334 and the word line 332, specific switching transistor 330 is turned on and a specific cell is chosen uniquely. And the bit information recorded on the magnetic-recording layer which constitutes the magnetoresistance effect element 321 can be read by detecting with a sense amplifier 352.

When writing in bit information, writing current is passed in the specific write-in word line 323 and the specific bit line 322, respectively, and the current magnetic field is applied to the recording layer of a specific cell.

Figure 26:
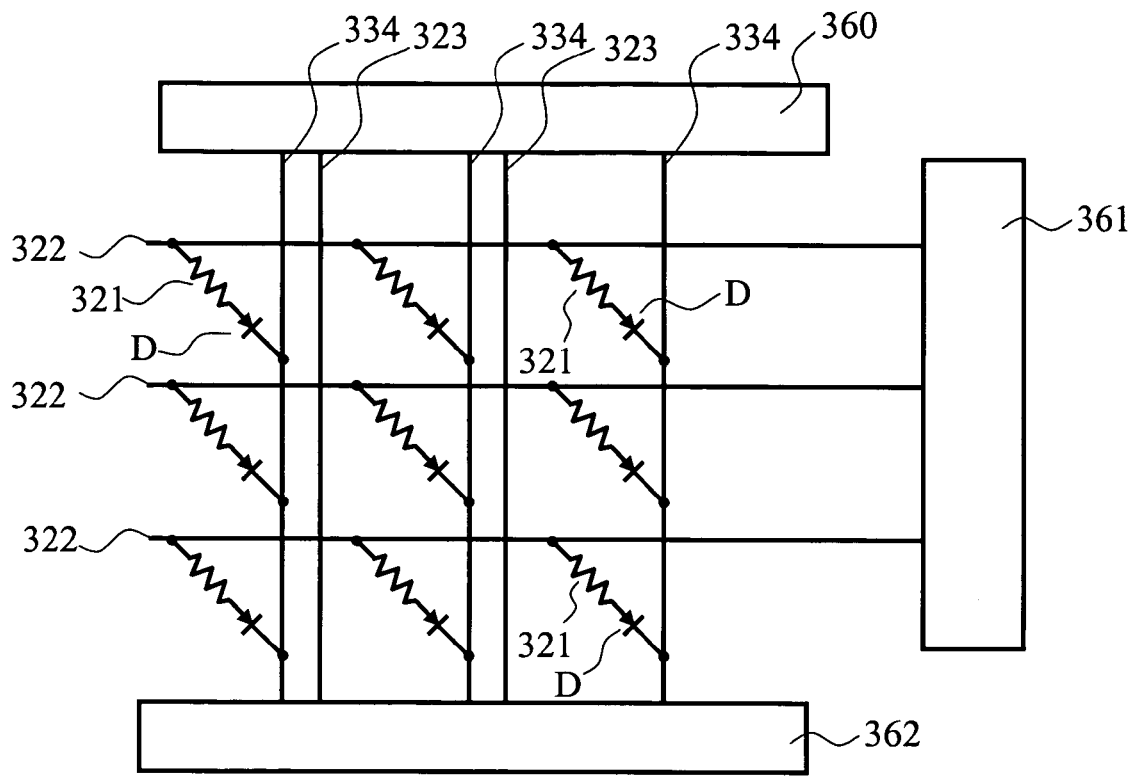
FIG. 26 is a schematic diagram showing the other example of the matrix structure of the magnetic memory of the embodiment of the present invention.

FIG. 26 is a conceptual diagram showing another example of the matrix structure of the magnetic memory of the embodiment. That is, in the case of this example, the bit lines 322 and word lines 334 which were wired in the shape of a matrix are chosen by decoders 360 and 361, respectively, and the specific memory cell in an array is chosen uniquely.

Each memory cell has the structure where Diode D is connected with the magnetoresistance effect element 321 in series.

Here, Diode D has the role to prevent that sense current detours in memory cells other than magnetoresistance effect element 321 selected.

In writing, write-in current is passed in a specific bit line 322 and a word line 323, thereby applying the current magnetic field to the recording layer of a specific cell.

Figure 27:
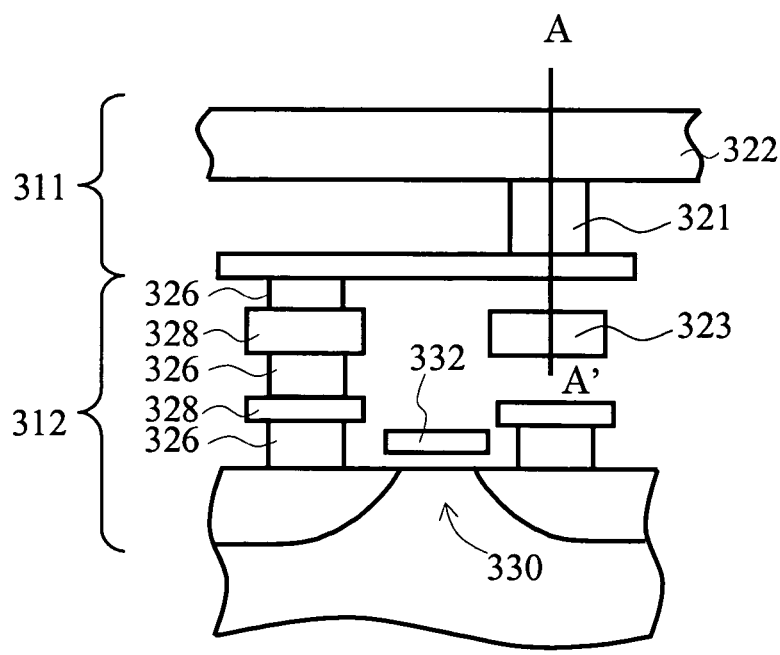
FIG. 27 is a schematic diagram showing the principal part section structure of the magnetic memory according to the embodiment of the present invention.

FIG. 27 is a conceptual diagram showing a principal part of the cross sectional structure of a magnetic memory according to an embodiment of the invention.

Figure 28:
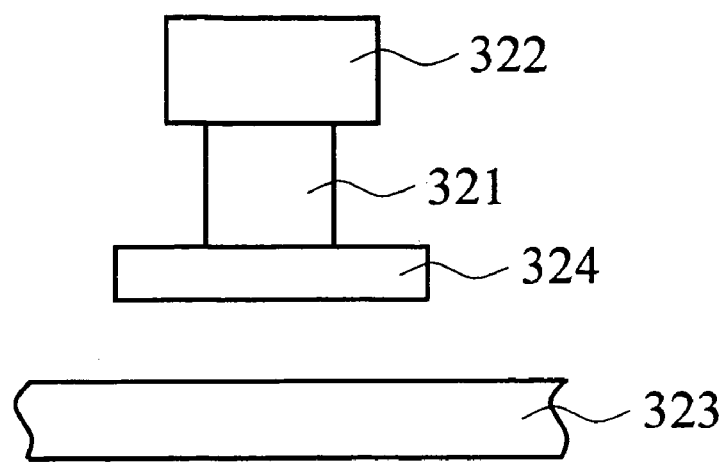
FIG. 28 is the A–A' line sectional view of FIG. 27.
Figure 29:
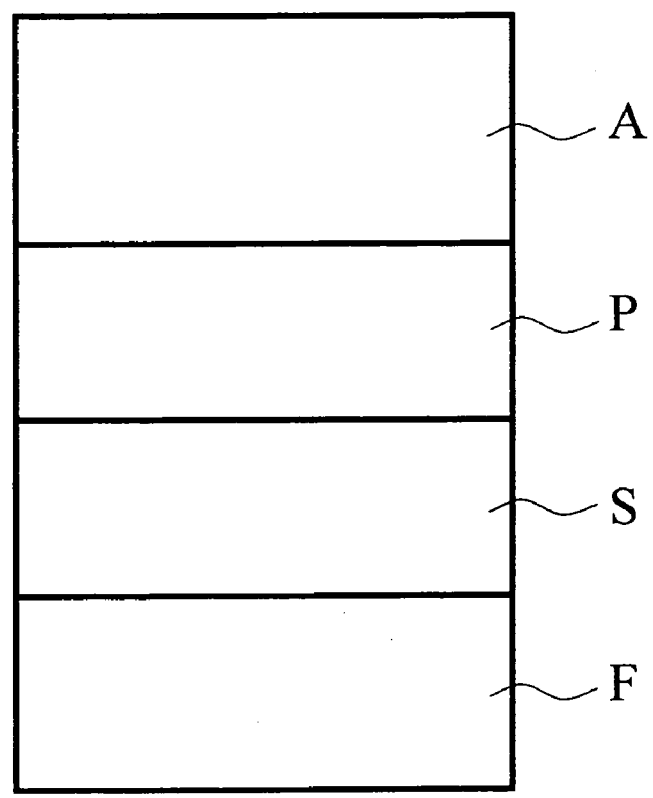
FIG. 29 is the schematic diagram which illustrates the outline section structure of the spin valve film.

And FIG. 28 shows the A-A' line sectional view.

That is, the structure shown in these figures corresponds to the memory cell of the 1-bit portion of the magnetic memory which operates as a random access memory.

This memory cell consists of a storage cell portion 311 and a transistor portion 312 for address selection. The storage cell portion 311 has the magnetoresistance effect element 321 and a pair of wiring 322 and 324 connected to the element 321. The magnetoresistance effect element 321 has a structure mentioned with reference to FIGS. 1 through 22, and shows a large magnetoresistance effect.

What is necessary is to pass sense current for the magnetoresistance effect element 321 in the case of bit information read-out, and just to detect the resistance change. In addition, the magnetization free layer of the magnetoresistance effect element can be used as the magnetic recording layer.

A selecting transistor 330 connected through a via 326 and buried wiring 328 is formed in a transistor portion 312 for selection. This transistor 330 carries out switching operation according to the voltage applied to a gate 332, and controls switching of the current path between the magnetoresistance effect element 321 and wiring 334.

Moreover, under the magnetoresistance effect element, the write-in wiring 323 is formed in the direction which intersects the wiring 322. These write-in wirings 322 and 323 can be formed with the alloy containing aluminum (Al), copper (Cu), tungsten (W), tantalum (Ta), or one of these.

In a memory cell of such structure, when writing bit information in the magnetoresistance effect element 321, a write-in pulse current is passed to the wirings 322 and 323. Then, a synthetic magnetic field induced by these current is applied to a record layer, and magnetization of a record layer of the magnetoresistance effect element can be reversed suitably.

On the other hand, when reading bit information, sense current is passed through wiring 322, the magnetoresistance effect element 321 containing a magnetic-recording layer, and the lower electrode 324, and a change of the resistance of the magnetoresistance effect element 321 or resistance itself is measured.

By using the magnetoresistance effect element mentioned with reference to FIGS. 1 through 22, a large magnetoresistance effect is obtained. Therefore, a stable read-out can be performed even if the cell size is reduced to realize a large capacity storage.

Heretofore, embodiments of the invention have been explained in detail with reference to some specific examples. The invention, however, is not limited to these specific examples.

For example, material, shape and thickness of the ferromagnetic layer, anti-ferromagnetic layer, insulating film and ferromagnetic film of the magnetoresistance effect element according to the invention may be appropriately selected by those skilled in the art within the known techniques to carry out the invention as taught in the specification and obtain equivalent effects.

Further, in a case where the magnetoresistance effect element of the invention is applied to a magnetic head, by providing magnetic shields on upper and lower side of the element, the reproducing resolution can be regulated.

It will be also appreciated that the invention is applicable not only to optically-assisted magnetic heads or magnetic recording apparatuses of the lengthwise recording type but also to those of the perpendicular magnetic recording type and ensures substantially the same effects.

Further, the magnetic reproducing apparatus according to the present invention may be of a fixed type in which specific magnetic recording medium is permanently installed, while it may be of a removable type in which the magnetic recording medium can be replaced easily.

Further, also concerning the magnetic memory according to the invention, those skilled in the art will be able to carry out the invention by appropriately selecting a material or a structure within the known techniques.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetoresistance effect element comprising:
   a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers;
   a pair of electrodes electrically coupled to the magnetoresistance effect film and configured to supply a sense current perpendicularly to a film plane of the magnetoresistance effect film; and
   a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases, wherein the alloy includes at least one element selected from the first group consisting of silver, gold, platinum, palladium, iridium, osmium and copper, and at least one element selected from the second group consisting of nickel, iron and cobalt, and in a case where the alloy is expressed by a formula $M_x(Ni_{100-y}(Fe_{100-z}Co_z)_y)_{100-x}$ where M denotes the element selected from the first group, the composition x is in a range between 1 atomic % and 50 atomic %, the composition y is in a range between 0 atomic % and 50 atomic %, and the composition z is in a range between 0 atomic % and 100 atomic %, or in a case where the alloy is expressed by a formula $M_u(Co_{100-v}(Fe_{100-w}Ni_w)_v)_{100-u}$ where M denotes the element selected from the first group, the composition u is in a range between 1 atomic % and 50% atomic %, the composition v is in a range between 0 atomic % and 50 atomic %, and the composition w is in a range between 0 atomic % and 100 atomic %.

2. A magnetoresistance effect element comprising:

a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers;

a pair of electrodes electrically coupled to the magnetoresistance effect film and configured to supply a sense current perpendicularly to a film plane of the magnetoresistance effect film; and a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases, wherein the alloy includes aluminum, at least one element selected from the first group consisting of silver, gold, platinum, palladium, iridium, osmium and copper, and at least one element selected from the second group consisting of magnesium, calcium, silicon, germanium, boron, tantalum, tungsten, niobium, zirconium, titan, chromium, zinc, lithium and gallium, and in a case where the alloy is expressed by a formula $(Al_{100-y}Q_y)_{100-x}M_x$ where M denotes the element selected from the first group and Q denotes the elements selected from the second group, the composition x is in a range between 1 atomic % and 40 atomic %, and the composition y is in a range between 0 atomic % and 30 atomic %.

3. A magnetoresistance effect element comprising:

a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers;

a pair of electrodes electrically coupled to the magnetoresistance effect film and configured to supply a sense current perpendicularly to a film plane of the magnetoresistance effect film; and a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases, wherein the alloy includes magnesium, at least one element selected from the first group consisting of silver, gold, platinum, palladium, iridium, osmium and copper, and at least one element selected from the second group consisting of aluminum, calcium, silicon, germanium, boron, tantalum, tungsten, niobium, zirconium, titan, chromium, zinc, lithium and gallium, and in a case where the alloy is expressed by a formula $(Mg_{100-y}Q_y)_{100-x}M_x$ where M denotes the element selected from the first group and Q denotes the elements selected from the second group, the composition x is in a range between 1 atomic % and 40 atomic %, and the composition y is in a range between 0 atomic % and 30 atomic %.

4. A magnetoresistance effect element comprising:

a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers;

a pair of electrodes electrically coupled to the magnetoresistance effect film and configured to supply a sense current perpendicularly to a film plane of the magnetoresistance effect film; and a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases, wherein the alloy includes silicon, at least one element selected from the first group consisting of silver, gold, platinum, palladium, iridium, osmium and copper, and at least one element selected from the second group consisting of magnesium, calcium, aluminum, germanium, boron, tantalum, tungsten, niobium, zirconium, titan, chromium, zinc, lithium and gallium, and in a case where the alloy is expressed by a formula $(Si_{100-y}Q_y)_{100-x}M_x$ where M denotes the element selected from the first group and Q denotes the elements selected from the second group, the composition x is in a range between 1 atomic % and 40 atomic %, and the composition y is in a range between 0 atomic % and 30 atomic %.

5. A magnetoresistance effect element comprising:

a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers;

a pair of electrodes electrically coupled to the magnetoresistance effect film and configured to supply a sense current perpendicularly to a film plane of the magnetoresistance effect film; and a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases, wherein the other of the first and second phases includes an magnetic element in higher concentration than the one of the first and second phases.

6. A magnetoresistance effect element comprising:

a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers;

a pair of electrodes electrically coupled to the magnetoresistance effect film and configured to supply a sense current perpendicularly to a film plane of the magnetoresistance effect film; and a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases, wherein the other of the first and second phases includes an magnetic element in higher concentration than the one of the first and second phases, and wherein the other of the first and second phases is dotted in the one of the first and second phases, and is forming a magnetic contact connecting the first and the second ferromagnetic layers.

7. A magnetoresistance effect element comprising:

a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers;

a pair of electrodes electrically coupled to the magnetoresistance effect film and configured to supply a sense current perpendicularly to a film plane of the magnetoresistance effect film; and a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases, wherein the alloy includes iron, and at least one element selected from the group consisting of molybdenum, magnesium, calcium, titan, zirconium, niobium, hafnium, tantalum, boron, aluminum and silicon, and in a case where the alloy is expressed by a formula $M_{100-x}Fe_x$ where M denotes the element selected from the group, the composition x is in a range between 1 atomic % and 50 atomic %.

8. A magnetoresistance effect element comprising:

a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers;

a pair of electrodes electrically coupled to the magnetoresistance effect film and configured to supply a sense current perpendicularly to a film plane of the magnetoresistance effect film; and a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases, wherein the alloy includes nickel, and at least one element selected from the group consisting of molybdenum, magnesium, tungsten, titan, zirconium, niobium, hafnium, tantalum, boron, aluminum and silicon, and in a case where the alloy is expressed by a formula $M_{100-x}Ni_x$ where M denotes the element selected from the group, the composition x is in a range between 1 atomic % and 50 atomic %.

9. A magnetoresistance effect element comprising:

a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers;

a pair of electrodes electrically coupled to the magnetoresistance effect film and configured to supply a sense current perpendicularly to a film plane of the magnetoresistance effect film; and a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases, wherein the alloy includes cobalt, and at least one element selected from the group consisting of molybdenum, magnesium, tungsten, titan, zirconium, niobium, hafnium, tantalum, boron, aluminum, chromium and vanadium, and in a case where the alloy is expressed by a formula $M_{100-x}Co_x$ where M denotes the element selected from the group, the composition x is in a range between 1 atomic % and 50 atomic %.

10. A magnetoresistance effect element comprising:
a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers;
a pair of electrodes electrically coupled to the magnetoresistance effect film and configured to supply a sense current perpendicularly to a film plane of the magnetoresistance effect film; and
a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases, wherein the phase separation layer has a lamination of a first layer and a second layer,
the first layer includes a plurality of phases formed by a phase separation in a solid phase from a first alloy, and
the second layer includes a plurality of phases formed by a phase separation in a solid phase from a second alloy different from the first alloy.

11. A magnetic head comprising a magnetoresistance effect element comprising:
a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers;
a pair of electrodes electrically coupled to the magnetoresistance effect film and configured to supply a sense current perpendicularly to a film plane of the magnetoresistance effect film; and
a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases, wherein
the other of the first and second phases includes a magnetic element in higher concentration than the one of the first and second phases.

12. A magnetic reproducing apparatus which reads magnetic information in a magnetic recording medium, the magnetic reproducing apparatus comprising a magnetoresistance effect element for reading the magnetic information comprising:
a magnetoresistance effect film including a first ferromagnetic layer whose direction of magnetization is pinned substantially in one direction, a second ferromagnetic layer whose direction of magnetization changes in response to an external magnetic field, and an intermediate layer provided between the first and second ferromagnetic layers;
a pair of electrodes electrically coupled to the magnetoresistance effect film and configured to supply a sense current perpendicularly to a film plane of the magnetoresistance effect film; and
a phase separation layer provided between the pair of electrodes, the phase separation layer comprising a first phase and a second phase formed by a phase separation in a solid phase from an alloy including a plurality of elements, one of the first and second phases including at least one element selected from the group consisting of oxygen, nitrogen, fluorine and carbon in higher concentration than other of the first and second phases, wherein
the other of the first and second phases includes a magnetic element in higher concentration than the one of the first and second phases.

* * * * *